US012684930B2

(12) United States Patent
Min et al.

(10) Patent No.: US 12,684,930 B2
(45) Date of Patent: Jul. 14, 2026

(54) DISPLAY DEVICE

(71) Applicant: Samsung Display Co., LTD., Yongin-si (KR)

(72) Inventors: Jun Seok Min, Suwon-si (KR); Won Tae Kim, Suwon-si (KR); Soo Hyun Moon, Suwon-si (KR); Woo Guen Jang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 686 days.

(21) Appl. No.: 18/074,395

(22) Filed: Dec. 2, 2022

(65) Prior Publication Data

US 2023/0231081 A1     Jul. 20, 2023

(30) Foreign Application Priority Data

Jan. 14, 2022    (KR) ........................ 10-2022-0005730

(51) Int. Cl.
*H10H 29/37*      (2025.01)
*H10H 20/85*      (2025.01)
*H10H 20/857*     (2025.01)
*H10W 90/00*      (2026.01)

(52) U.S. Cl.
CPC ........ *H10H 29/37* (2025.01); *H10H 20/8506* (2025.01); *H10H 20/857* (2025.01); *H10W 90/00* (2026.01)

(58) Field of Classification Search
CPC ...................................................... H10H 29/37
See application file for complete search history.

(56) References Cited

U.S. PATENT DOCUMENTS

2021/0167124 A1\*   6/2021   Min ...................... H10H 20/821
2022/0028845 A1\*   1/2022   Yu ........................ H01L 25/0753

FOREIGN PATENT DOCUMENTS

| KR | 10-1436123 B1 | | 11/2014 |
|---|---|---|---|
| KR | 2021-0090338 A | | 7/2021 |
| WO | WO/2020/027397 | \* | 2/2020 |

\* cited by examiner

*Primary Examiner* — Feifei Yeung Lopez
(74) *Attorney, Agent, or Firm* — Womble Bond Dickinson (US) LLP

(57)                ABSTRACT

A display device includes a first barrier wall and a second barrier wall spaced from each other on a substrate; a first electrode on the first barrier wall and extending in a first direction; a second electrode on the second barrier wall and spaced from the first electrode in a second direction, the second electrode extending in the first direction; and light emitting elements between the first and second barrier walls and on the first electrode and the second electrode, wherein the first barrier wall includes a first portion and a second portion that is located further from the second barrier wall than the first portion is, and the second barrier wall includes a third portion opposing the first portion and a fourth portion that is located further from the first barrier wall than the third portion is.

15 Claims, 25 Drawing Sheets

10

NDA

DPA

DR1

DR2

RME: RME1, RME2

RME: RME1, RME2

FIG. 5

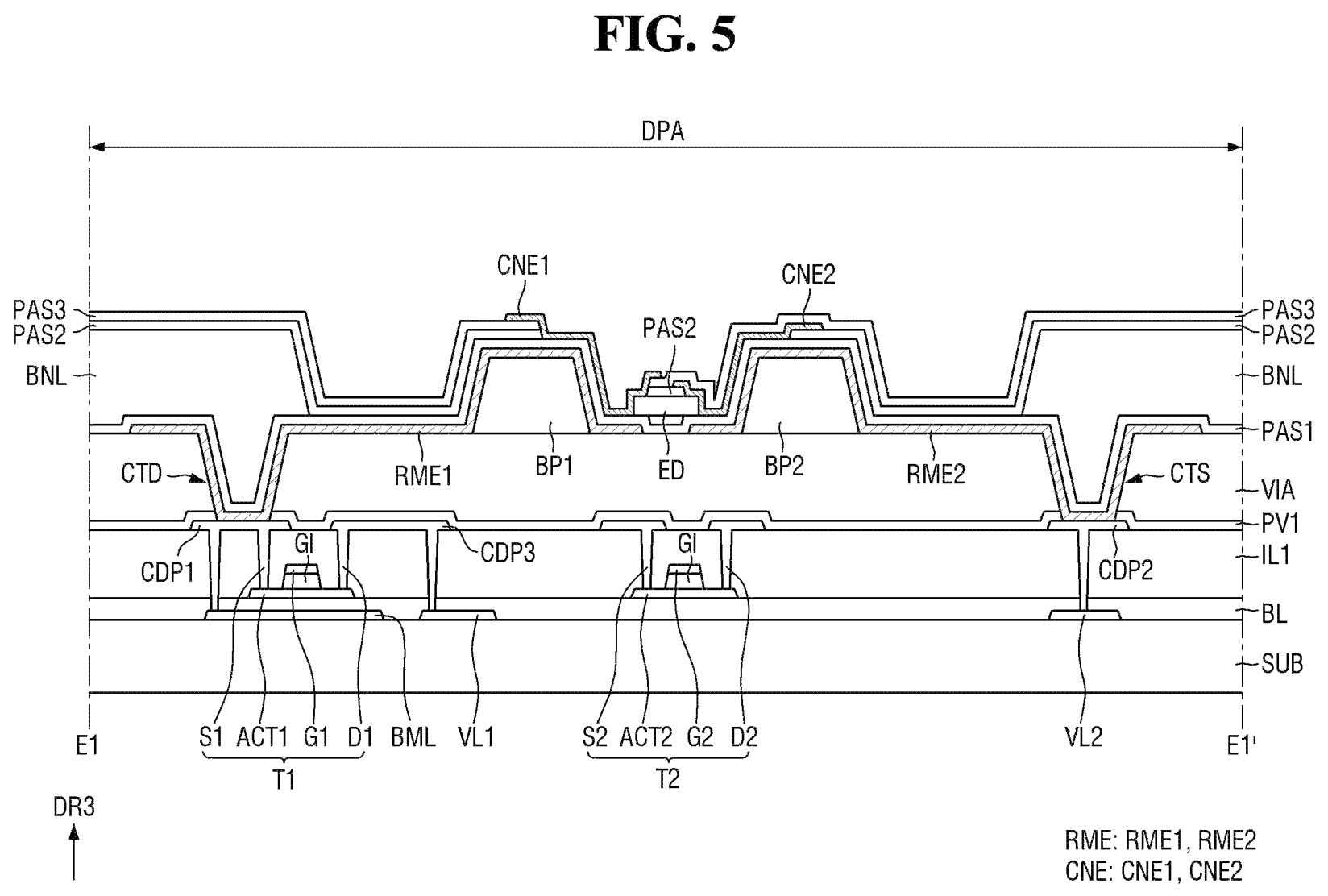

PAS3
PAS2
BNL
PAS1
VIA
PV1
IL1
BL
SUB

E1'

CTS

CDP2

VL2

RME2

CNE2

BP2

D2
G2
ACT2
S2
T2

PAS2

ED

GI

BP1

CNE1

CDP3

RME1

VL1

BML

D1
G1
ACT1
S1
T1

GI

CTD

CDP1

DPA

PAS3
PAS2
BNL

E1

DR3

RME: RME1, RME2
CNE: CNE1, CNE2

FIG. 6

RME: RME1, RME2
CNE: CNE1, CNE2

FIG. 7

RME: RME1, RME2
CNE: CNE1, CNE2

FIG. 8

RME: RME1, RME2
CNE: CNE1, CNE2

RME: RME1, RME2

FIG. 12

RME: RME1, RME2
CNE: CNE1, CNE2

RME: RME1, RME2

10_4

CNE1
CNE2
BP1_4
BP2_4
ED
E9 ← --- → E9'
RME1
RME2
E8 ← --- → E8'
EMA
SA
ROP

DR1
DR2

CT1    CT2

RME: RME1, RME2
CNE: CNE1, CNE2

RME: RME1, RME2
ED: ED_A, ED_B, ED_C

FIG. 17

RME: RME1, RME2
CNE: CNE1, CNE2

RME: RME1, RME2, RME3, RME4
CNE: CNE1, CNE2, CNE3, CNE4, CNE5
ED: ED1, ED2, ED3, ED4

RME: RME1, RME2, RME3, RME4
CNE: CNE1, CNE2, CNE3, CNE4
ED: ED1, ED2

RME: RME1, RME2, RME3, RME4
CNE: CNE1, CNE2, CNE3, CNE4

RME: RME1, RME2
CNE: CNE1, CNE2, CNE3
ED: ED1, ED2

FIG. 23

RME: RME1, RME2
CNE: CNE1, CNE2, CNE3
ED: ED1, ED2

DISPLAY DEVICE

CROSS-REFERENCE TO RELATED APPLICATION

This application claims priority to and the benefit of Korean Patent Application No. 10-2022-0005730 filed on Jan. 14, 2022, in the Korean Intellectual Property Office, the entire content of which is incorporated by reference herein.

BACKGROUND

1. Field

The present disclosure relates to a display device.

2. Description of the Related Art

The importance of display devices has steadily increased with the development of multimedia technology. In response thereto, various types of display devices such as an organic light emitting diode (OLED) display, a liquid crystal display (LCD), and the like, have been used.

As a device for displaying an image, there is a self-light emitting display device including a light emitting element. The self-light emitting display device includes an organic light emitting display device using an organic material as a light emitting material as a light emitting element, an inorganic light emitting display device using an inorganic material as a light emitting material, or the like.

SUMMARY

Aspects and features of embodiments of the present disclosure provide a display device capable of preventing or reducing aggregation of light emitting elements intended to be spaced from each other.

However, aspects and features of embodiments of the present disclosure are not restricted to the ones set forth herein. The above and other aspects of the present disclosure will become more apparent to one of ordinary skill in the art to which the present disclosure pertains by referencing the detailed description of the present disclosure given below.

In a display device according to one or more embodiments, light emitting elements may be disposed between barrier walls that are spaced from each other. Sides of the barrier walls opposing each other may not be parallel with each other, and may have a partially concave shape (e.g., groove shape). Accordingly, in a manufacturing process of the display device, it is possible to reduce or minimize the light emitting elements between the barrier walls from moving along the shape of the barrier walls, and to prevent or reduce aggregation of the light emitting elements.

The display device according to one or more embodiments is capable of preventing aggregation of the light emitting elements, thereby reducing connection defects between the light emitting element and other electrodes, and improving product quality of the display device.

However, the effects, aspects, and features of embodiments of the present disclosure are not limited to the aforementioned effects, aspects, and features, and various other effects, aspects, and features are included in the present specification.

According to one or more embodiments of the present disclosure, a display device includes a first barrier wall and a second barrier wall spaced from each other on a substrate; a first electrode on the first barrier wall and extending in a first direction; a second electrode on the second barrier wall and spaced from the first electrode in a second direction, the second electrode extending in the first direction; and light emitting elements between the first and second barrier walls and on the first electrode and the second electrode, wherein the first barrier wall includes a first portion and a second portion that is located further from the second barrier wall than the first portion is, and the second barrier wall includes a third portion opposing the first portion and a fourth portion that is located further from the first barrier wall than the third portion is.

In one or more embodiments, opposing inner sides of the second portion of the first barrier wall and the fourth portion of the second barrier wall are concave and inner sides of the first portion and the third portion oppose in the second direction, respectively.

In one or more embodiments, a first distance between the first portion and the third portion is smaller than a second distance between the second portion and the fourth portion.

In one or more embodiments, a length of the light emitting elements is smaller than the first distance and the second distance.

In one or more embodiments, a distance between the first electrode and the second electrode is smaller than the first distance and smaller than a length of the light emitting elements.

In one or more embodiments, the first electrode and the second electrode have opposing first sides that extend in parallel with each other, an area of an overlapping portion between the first electrode and the first portion of the first barrier wall is greater than an area of an overlapping portion between the first electrode and the second portion of the first barrier wall, and an area of an overlapping portion between the second electrode and the third portion of the second barrier wall is greater than an area of an overlapping portion between the second electrode and the fourth portion of the second barrier wall.

In one or more embodiments, in the first barrier wall, a width of the first portion is greater than a width of the second portion, in the second barrier wall, a width of the third portion is greater than a width of the fourth portion, and other sides opposite to one sides of the first barrier wall and the second barrier wall opposing each other extend in the first direction in parallel with each other.

In one or more embodiments, the first electrode and the second electrode have second sides opposite to the first sides, the second sides extending in parallel with each other, respectively.

In one or more embodiments, in the first barrier wall, a width of the first portion is equal to a width of the second portion, in the second barrier wall, a width of the third portion is equal to a width of the fourth portion, and other sides opposite to one sides of the first barrier wall and the second barrier wall that oppose each other are not parallel with each other.

In one or more embodiments, a display device may further include a first connection electrode on the first electrode and the first barrier wall and extending in the first direction; and a second connection electrode on the second electrode and the second barrier wall and extending in the first direction, wherein the first connection electrode and the second connection electrode have opposing sides extending in parallel with each other.

In one or more embodiments, a distance between the first connection electrode and the second connection electrode is smaller than a length of the light emitting elements.

In one or more embodiments, the light emitting elements include: a first light emitting element located between the first portion of the first barrier wall and the third portion of the second barrier wall; a second light emitting element located between the second portion of the first barrier wall and the third portion of the second barrier wall; and a third light emitting element located between the first light emitting element and the second light emitting element.

In one or more embodiments, the second portion and the fourth portion of the first barrier wall and the second barrier wall include outer sides having a shape inclined in a direction between the first direction and the second direction.

In one or more embodiments, a display device may further include a third barrier wall spaced from the first barrier walls in the second direction with the second barrier wall interposed therebetween; a third electrode between the first electrode and the second electrode and located on the second barrier wall; and a fourth electrode on the third barrier wall and spaced from the second electrode in the second direction.

In one or more embodiments, a distance between the first portion of the first barrier wall and the third portion of the second barrier wall is smaller than a distance between the second portion of the first barrier wall and the fourth portion of the second barrier wall, and a distance between the third portion of the second barrier wall and the third barrier wall is smaller than a distance between the fourth portion of the second barrier wall and the third barrier wall.

In one or more embodiments, the second barrier wall has both sides of the fourth portion in the second direction, which are inwardly recessed toward a center of the second barrier wall from both sides of the third portion in the second direction.

In one or more embodiments, a display device includes a plurality of first barrier wall patterns to be spaced from each other in a first direction on a substrate; a plurality of second barrier wall patterns spaced from the first barrier wall patterns in a second direction, respectively, and spaced from each other in the first direction; a first electrode extending in the first direction and overlapping the plurality of first barrier wall patterns; a second electrode spaced from the first electrode in the second direction, extending in the first direction, and overlapping the plurality of second barrier wall patterns; and a plurality of light emitting elements located on the first electrode and the second electrode, wherein each of the first electrode and the second electrode has opposing sides extending in parallel with each other, and a part of the first electrode is located between the first barrier wall patterns, and a part of the second electrode is located between the second barrier wall patterns.

In one or more embodiments, a distance between the first and second barrier wall patterns opposing each other in the second direction is greater than a distance between the plurality of first barrier wall patterns, and a length of the plurality of light emitting elements is smaller than a distance between the plurality of first and second barrier wall patterns, and is larger than a distance between the first and second electrodes.

In one or more embodiments, the plurality of light emitting elements include: a first light emitting element located between the first barrier wall pattern and the second barrier wall pattern; and a second light emitting element located between regions where the first barrier wall pattern and the second barrier wall pattern are not located.

In one or more embodiments, opposing sides of the plurality of first barrier wall patterns and the plurality of second barrier wall patterns that are spaced from each other in the first direction are parallel with each other.

In one or more embodiments, opposing sides of the plurality of first barrier wall patterns and the plurality of second barrier wall patterns that are spaced from each other in the first direction are inclined rather than parallel with each other.

BRIEF DESCRIPTION OF THE DRAWINGS

The above and other aspects and features of the present disclosure will become more apparent by describing in detail embodiments thereof with reference to the attached drawings, in which:

FIG. 5 is a cross-sectional view taken along the line E1-E1' of FIG. 2;

FIG. 6 is a cross-sectional view taken along the line E2-E2' of FIG. 2;

FIG. 7 is a cross-sectional view taken along the lines E3-E3' and E4-E4' of FIG. 2;

FIG. 8 is a cross-sectional view taken along the line E5-E5' of FIG. 2;

FIG. 12 is a cross-sectional view taken along the lines E6-E6' and E7-E7' of FIG. 10;

FIG. 17 is a cross-sectional view taken along the lines E8-E8' and E9-E9' of FIG. 15;

FIG. 23 is a cross-sectional view taken along the line N3-N3' of FIG. 22;

DETAILED DESCRIPTION

The present disclosure will now be described more fully hereinafter with reference to the accompanying drawings, in which embodiments of the present disclosure are shown. This disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Features of each of various embodiments of the present disclosure may be partially or entirely combined with each other and may technically variously interwork with each other, and respective embodiments may be implemented independently of each other or may be implemented together in association with each other.

Hereinafter, embodiments will be described with reference to the accompanying drawings.

Figure 1:
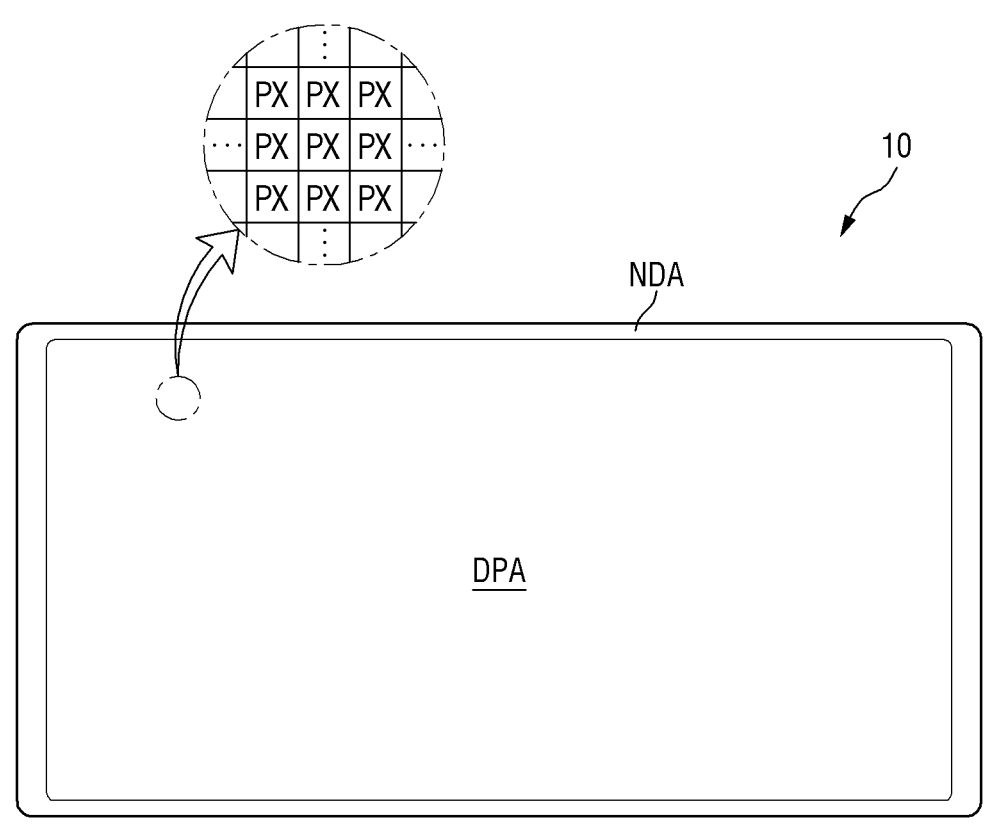
FIG. 1 is a schematic plan view of a display device according to one or more embodiments.
Figure 1:
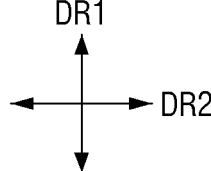

FIG. 1 is a schematic plan view of a display device according to one or more embodiments.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel that provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be exemplified, but the present disclosure is not limited thereto, and other display panels may be applied within the same scope of technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. FIG. 1 illustrates the display device 10 having a rectangular shape elongated in a second direction DR2.

The display device 10 may include the display area DPA and a non-display area NDA around the edge or periphery of the display area DPA. The display area DPA is an area where an image can be displayed, and the non-display area NDA is an area where no image is displayed. The display area DPA may also be referred to as an active region, and the non-display area NDA may also be referred to as a non-active region. The display area DPA may substantially occupy the center of the display device 10.

The display area DPA may include a plurality of pixels PX. The plurality of pixels PX may be arranged in a matrix. For example, the plurality of pixels PX may be arranged along rows and columns of a matrix. The shape of each pixel PX may be a rectangular or square shape in a plan view. However, the present disclosure is not limited thereto, and it may be a rhombic shape in which each side is inclined with respect to one direction. The pixels PX may be arranged in a stripe type or an island type or a PENTILE® arrangement structure, but the present disclosure is not limited thereto. This PENTILE® arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. In addition, each of the pixels PX may include one or more light emitting elements that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
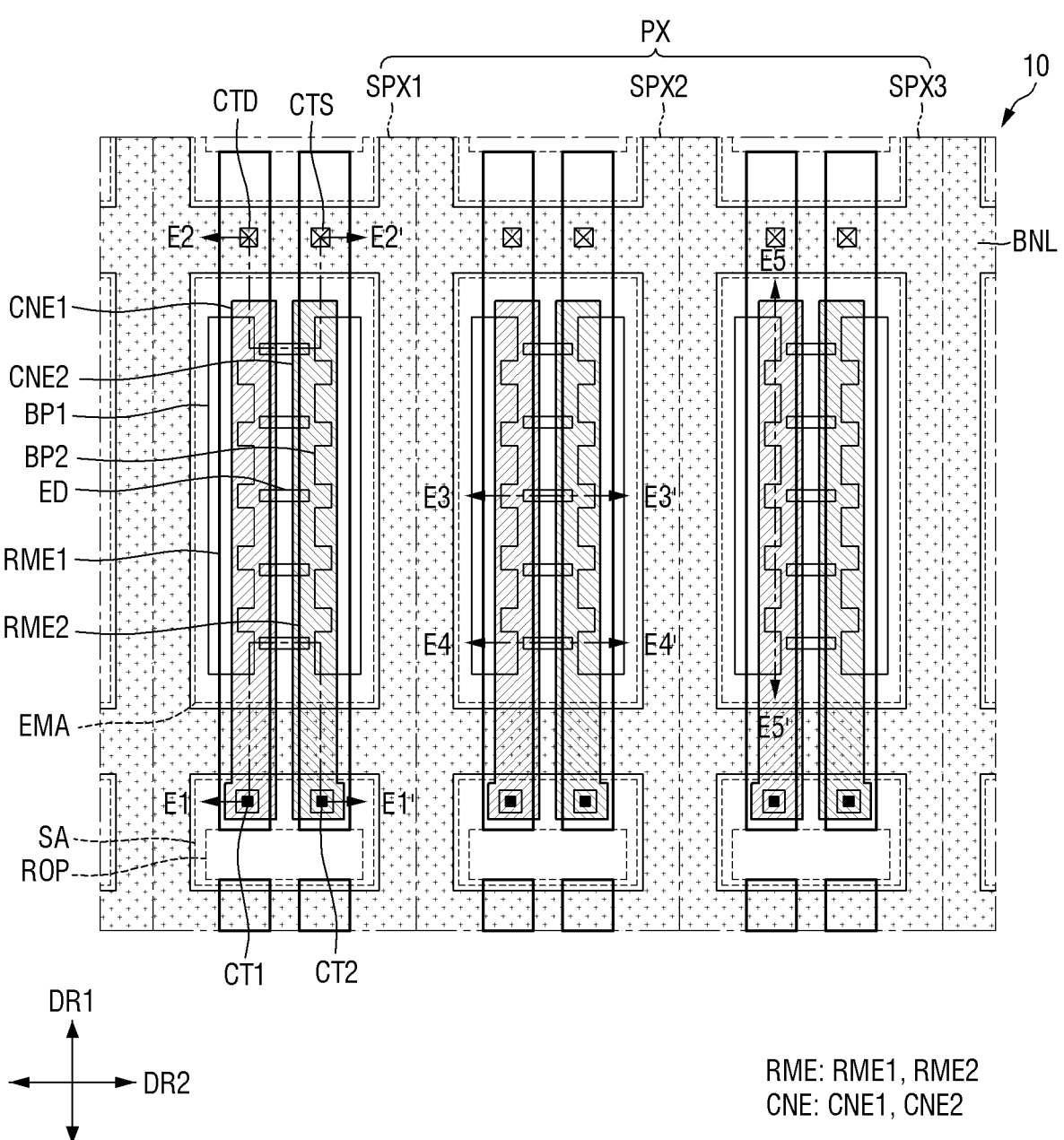
FIG. 2 is a plan view illustrating one pixel of a display device according to one or more embodiments.
Figure 3:
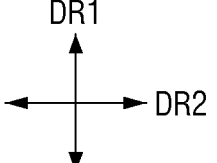
FIG. 3 is a plan view illustrating an arrangement of barrier walls, electrodes, and light emitting elements in one pixel of a display device according to one or more embodiments.

FIG. 2 is a plan view illustrating one pixel of a display device according to one or more embodiments. FIG. 3 is a plan view illustrating an arrangement of barrier walls, electrodes, and light emitting elements in one pixel of a display device according to one or more embodiments.

FIG. 2 illustrates a planar arrangement of electrodes RME (RME1 and RME2), barrier walls BP1 and BP2, a bank layer BNL, a plurality of light emitting elements ED, and connection electrodes CNE (CNE1 and CNE2) disposed in one pixel PX of the display device 10. FIG. 3 illustrates the arrangement of the barrier walls BP1 and BP2, the electrodes RME1 and RME2, and the light emitting elements ED in one pixel PX of FIG. 2 except the connection electrodes CNE (CNE1 and CNE2).

Referring to FIGS. 2 and 3, each of the pixels PX of the display device 10 may include a plurality of sub-pixels SPXn. For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the present disclosure is not limited thereto, and the sub-pixels SPXn may emit light of the same color. In one or more embodiments, each of the sub-pixels SPXn may emit blue light. Although it is illustrated in the drawing that one pixel PX includes three sub-pixels SPXn, the present disclosure is not limited thereto, and the pixel PX may include a larger number of sub-pixels SPXn.

Each sub-pixel SPXn of the display device 10 may include an emission area EMA and a non-emission area. The emission area EMA may be an area in which the light emitting element ED is disposed to emit light of a specific wavelength band. The non-emission area may be a region in which the light emitting element ED is not disposed and a region from which light is not emitted because light emitted from the light emitting element ED does not reach it.

The emission area EMA may include the region in which the light emitting element ED is disposed, and a region adjacent to the light emitting element ED in which the lights emitted from the light emitting element ED are emitted. For example, the emission area EMA may further include a region in which the light emitted from the light emitting element ED is reflected or refracted by another member and emitted. The plurality of light emitting elements ED may be disposed in each sub-pixel SPXn, and the emission area may be formed to include an area where the light emitting elements ED are disposed and an area adjacent thereto.

Although it is shown in the drawing that the sub-pixels SPXn have the emission areas EMA that are substantially identical in size, the present disclosure is not limited thereto. In one or more embodiments, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA of the corresponding sub-pixel SPXn may be disposed on the lower side of the emission area EMA, which is the other side in the first direction DR1. The emission area EMA and the sub-region SA may be alternately arranged along the first direction DR1, and the sub-region SA may be disposed between the emission areas EMA of different sub-pixels SPXn spaced from each other in the first direction DR1. For example, the emission area EMA and the sub-region SA may be alternately arranged along the first direction DR1, and each of the emission area EMA and the sub-region SA may be repeatedly arranged along the second direction DR2. However, the present disclosure is not limited thereto, and the arrangement of the emission areas EMA and the sub-regions SA in the plurality of pixels PX may be different from that shown in FIG. 2.

Light may not be emitted from the sub-region SA because the light emitting element ED is not disposed in the sub-region SA, but an electrode RME disposed in each sub-pixel SPXn may be partially disposed in the sub-region SA. The electrodes RME disposed in different sub-pixels SPXn may be disposed to be separated at a separation portion ROP of the sub-region SA.

The display device 10 may include the plurality of electrodes RME (RME1 and RME2), the barrier walls BP1 and BP2, the bank layer BNL, the light emitting elements ED, and the connection electrodes CNE (CNE1 and CNE2).

The plurality of barrier walls BP1 and BP2 may be disposed in the emission area EMA of each sub-pixel SPXn. The barrier walls BP1 and BP2 may be disposed to extend substantially in the first direction DR1 and may be spaced from each other in the second direction DR2.

For example, the barrier walls BP1 and BP2 may include a first barrier wall BP1 and a second barrier wall BP2 spaced from each other in the second direction DR2 in the emission area EMA of each sub-pixel SPXn. The first barrier wall BP1 may be disposed on the left side with respect to the center of the emission area EMA, which is one side in the second direction DR2, and the second barrier walls BP2 may be disposed on the right side with respect to the center of the emission area EMA, which is the other side in the second direction DR2, while being spaced from the first barrier wall BP1. The first barrier wall BP1 and the second barrier wall BP2 may be alternately disposed along the second direction DR2 and may be disposed in an island-shaped pattern in the display area DPA. The plurality of light emitting elements ED may be arranged between the first barrier wall BP1 and the second barrier wall BP2.

The lengths of the first barrier wall BP1 and the second barrier wall BP2 in the first direction DR1 may be the same, and may be smaller than the length of the emission area EMA surrounded by the bank layer BNL in the first direction DR1. The first barrier wall BP1 and the second barrier wall BP2 may be spaced from a portion of the bank layer BNL extending in the second direction DR2. However, the present disclosure is not limited thereto, and the barrier walls BP1 and BP2 may be integrated with the bank layer BNL, or may partially overlap the portion of the bank layer BNL extending in the second direction DR2. In this case, the lengths of the barrier walls BP1 and BP2 in the first direction DR1 may be greater than or equal to the length of the emission area EMA surrounded by the bank layer BNL in the first direction DR1.

According to one or more embodiments, a distance between the first barrier wall BP1 and the second barrier wall BP2 may vary according to a location thereof. Because sides of the first barrier wall BP1 and the second barrier wall BP2, which face (e.g., oppose) each other, are formed to be partially concave (e.g., grooved), the distance therebetween may vary according to the location. As will be described later, in the display device 10, the light emitting element ED is disposed between the barrier walls BP1 and BP2, and the distance between the barrier walls BP1 and BP2 is designed to vary according to the location. Therefore, it is possible to prevent the light emitting elements ED from aggregating at a specific location between the barrier walls BP1 and BP2. A detailed description thereof will be given later with reference to other drawings.

Although it is illustrated in the drawing that two barrier walls BP1 and BP2 are arranged for each sub-pixel SPXn, the present disclosure is not limited thereto. The number and the shape of the barrier walls BP1 and BP2 may vary depending on the number or the arrangement structure of the electrodes RME.

The plurality of electrodes RME (RME1 and RME2) have a shape extending in one direction and are disposed for each sub-pixel SPXn. The plurality of electrodes RME1 and RME2 may extend in the first direction DR1 to be disposed across the emission area EMA of the sub-pixel SPXn and the sub-region SA, and may be disposed to be spaced from each other in the second direction DR2. The plurality of electrodes RME may be electrically connected to the light emitting elements ED to be described later. However, the present disclosure is not limited thereto, and the electrodes RME may not be electrically connected to the light emitting element ED.

The display device 10 may include the first electrode RME1 and the second electrode RME2 arranged in each sub-pixel SPXn. The first electrode RME1 is located on the left side with respect to the center of the emission area EMA, and the second electrode RME2 is located on the right side with respect to the center of the emission area EMA while being spaced from the first electrode RME1 in the second direction DR2. A first electrode RME1 may be disposed on the first barrier wall BP1, and a second electrode RME2 may be disposed on the second barrier wall BP2. The first electrode RME1 and the second electrode RME2 may be partially arranged in the corresponding sub-pixel SPXn and the sub-region SA over the bank layer BNL. The first electrode RME1 and the second electrode RME2 of different sub-pixels SPXn may be separated with respect to the separation portion ROP located in the sub-region SA of one sub-pixel SPXn.

Although it is illustrated in the drawing that two electrodes RME have a shape extending in the first direction DR1 for each sub-pixel SPXn, the present disclosure is not limited thereto. For example, the display device 10 may have a shape in which a larger number of electrodes RME are disposed in one sub-pixel SPXn or the electrodes RME are partially bent and have different widths depending on positions.

The bank layer BNL may be disposed to be around (e.g., to surround) the plurality of sub-pixels SPXn, the emission area EMA, and the sub-region SA. The bank layer BNL may be disposed at the boundary between the sub-pixels SPXn adjacent in the first direction DR1 and the second direction DR2, and may also be disposed at the boundary between the emission area EMA and the sub-region SA. The sub-pixels SPXn, the emission area EMA, and the sub-region SA of the display device 10 may be the areas distinguished by the arrangement of the bank layer BNL. The gaps between the plurality of sub-pixels SPXn, the emission areas EMA, and the sub-regions SA may vary depending on the width of the bank layer BNL.

The bank layer BNL may include portions extending in the first direction DR1 and the second direction DR2 in a plan view to be arranged in a grid pattern over the entire surface of the display area DPA. The bank layer BNL may be disposed along the boundaries between the sub-pixels SPXn to delimit the neighboring sub-pixels SPXn. The bank layer BNL may also be arranged to be around (e.g., to surround) the emission area EMA and the sub-region SA disposed for each sub-pixel SPXn to delimit them from each other.

The plurality of light emitting elements ED may be arranged in the emission area EMA. The light emitting elements ED may be disposed between the barrier walls BP1 and BP2, and may be arranged to be spaced from each other in the first direction DR1. In one or more embodiments, the plurality of light emitting elements ED may have a shape extending in one direction, and both ends thereof may be disposed on different electrodes RME. The length of the light emitting element ED may be greater than the gap between the electrodes RME that are spaced from each other in the second direction DR2. The extension direction of the light emitting elements ED may be substantially perpendicular to the first direction DR1 in which the electrodes RME extend. However, the present disclosure is not limited thereto, and the light emitting element ED may extend in the second direction DR2 or in a direction oblique to the second direction DR2.

The plurality of connection electrodes CNE (CNE1 and CNE2) may be disposed on the plurality of electrodes RME and the barrier walls BP1 and BP2. The plurality of connection electrodes CNE may have a shape extending in one direction, and may be disposed to be spaced from each other. Each of the connection electrodes CNE may be in contact with the light emitting element ED, and may be electrically connected to the electrode RME or a conductive layer thereunder.

The connection electrodes CNE may include the first connection electrode CNE1 and the second connection electrode CNE2 disposed in each sub-pixel SPXn. The first connection electrode CNE1 may have a shape extending in the first direction DR1 and may be disposed on the first electrode RME1 or the first barrier wall BP1. The first connection electrode CNE1 may partially overlap the first electrode RME1 and may be disposed across the emission area EMA and the sub-region SA over the bank layer BNL. The second connection electrode CNE2 may have a shape extending in the first direction DR1 and may be disposed on the second electrode RME2 or the second barrier wall BP2. The second connection electrode CNE2 may partially overlap the second electrode RME2 and may be disposed across the emission area EMA and the sub-region SA over the bank layer BNL.

Figure 4:
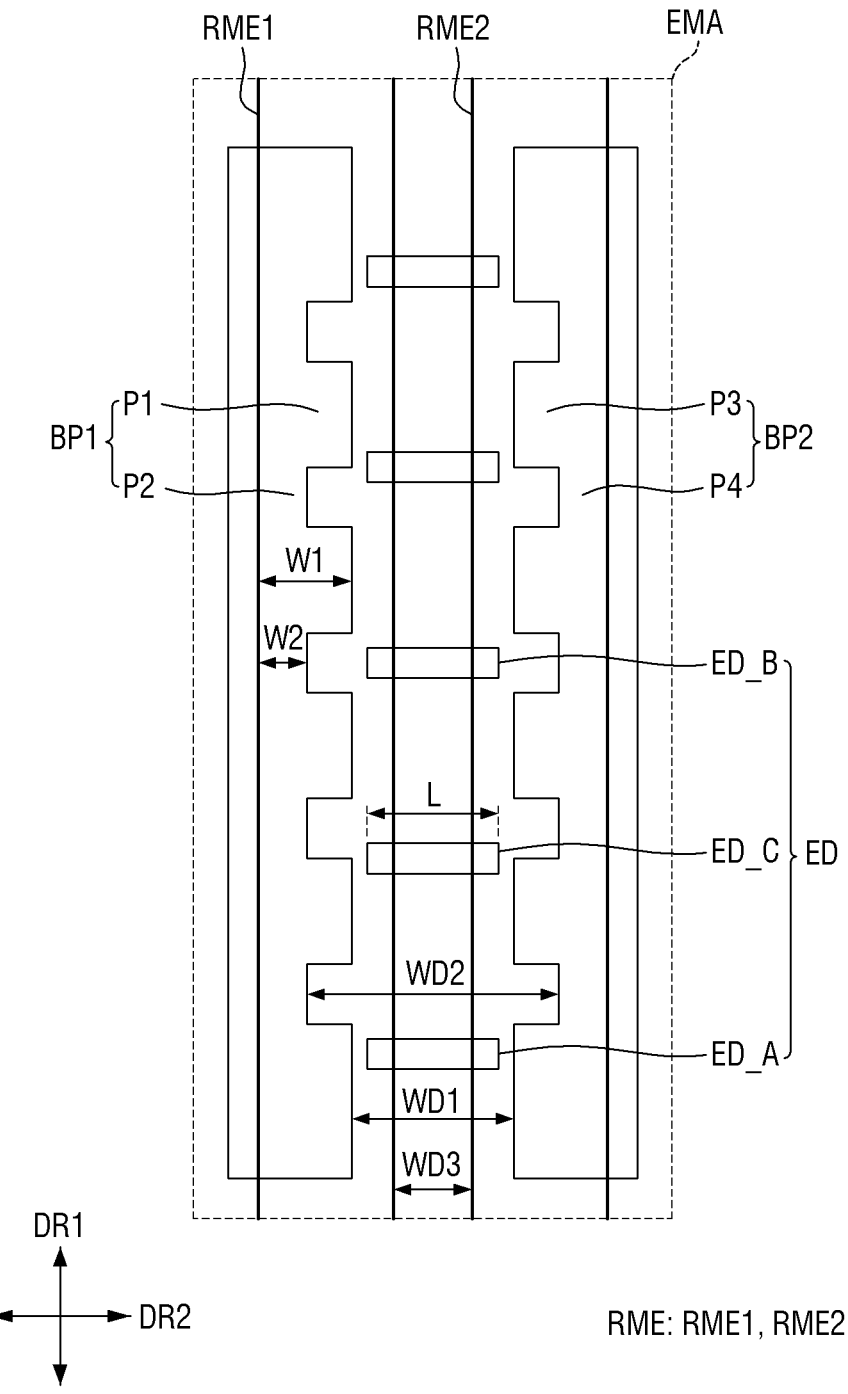
FIG. 4 is a plan view illustrating an arrangement of barrier walls, electrodes, and light emitting elements disposed in an emission area of one sub-pixel in the display device of FIG. 3.

FIG. 4 is a plan view illustrating an arrangement of barrier walls, electrodes, and light emitting elements disposed in an emission area of one sub-pixel in the display device of FIG. 3. FIG. 4 illustrates the arrangement of the barrier walls BP1 and BP2, the electrodes RME1 and RME2, and the light emitting elements ED disposed in the emission area EMA of one sub-pixel SPXn.

Referring to FIG. 4 in conjunction with FIGS. 2 and 3, in the display device 10 according to one or more embodiments, the distance between the first barrier wall BP1 and the second barrier wall BP2 may vary according to the location. Because the facing (e.g., opposing) sides of the first barrier wall BP1 and the second barrier wall BP2 are formed to be partially concave, the distance therebetween may vary according to the location.

For example, the first barrier wall BP1 may include a first portion P1 and a second portion P2 that is further distanced from the second barrier wall BP2 than the first portion P1. The second barrier wall BP2 may include a third portion P3 and a fourth portion P4 that is further distanced from the first barrier wall BP1 than the third portion P3. The second portion P2 and the fourth portion P4 may be portions formed to be recessed from the first portion P1 and the third portion P3 toward the insides of the barrier walls BP1 and BP2, respectively. In the first barrier wall BP1 and the second barrier wall BP2, the facing inner sides of the second portion P2 and the fourth portion P4 may be formed to be concave from the facing inner sides of the first portion P1 and the third portion P3 in the second direction DR2, respectively. The first portion P1 and the second portion P2 of the first barrier wall BP1 may be alternately disposed along the first direction DR1. The third portion P3 and the fourth portion P4 of the second barrier wall BP2 may be alternately disposed along the first direction DR1. The facing inner sides of the first barrier wall BP1 and the second barrier wall BP2 may not be formed to be parallel with each other in the first direction DR1 and may have an irregular structure.

The first portion P1 of the first barrier wall BP1 and the third portion P3 of the second barrier wall BP2 may face each other while being spaced from each other in the second direction DR2. The second portion P2 of the first barrier wall BP1 and the fourth portion P4 of the second barrier wall BP2 may face each other while being spaced from each other in the second direction DR2. A first distance WD1 between the first portion P1 of the first barrier wall BP1 and the third portion P3 of the second barrier wall BP2 may be smaller than a second distance WD2 between the second portion P2 of the first barrier wall BP1 and the fourth portion P4 of the second barrier wall BP2. In the first barrier wall BP1 and the second barrier wall BP2, the first portion P1 and the third portion P3, and the second portion P2 and the fourth portion P4 may be disposed to face each other, and the distances WD1 and WD2 between the barrier walls BP1 and BP2 may repeatedly increase and decrease along the first direction DR1.

During a manufacturing process of the display device 10, the light emitting elements ED may be prepared in a state of being dispersed in ink, and then may be sprayed onto the emission area EMA surrounded by the bank layer BNL. When the light emitting elements ED are sprayed, an electric signal is applied to the electrodes RME1 and RME2 to generate an electric field on the electrodes RME1 and RME2, and the light emitting elements ED may be disposed on the electrodes RME1 and RME2 with changes in the locations and the directions of both ends thereof by the electric field. The first barrier wall BP1 and the second barrier wall BP2 may form a region in which the light emitting elements ED are disposed in the emission area EMA, and the light emitting elements ED may be disposed between the barrier walls BP1 and BP2.

When the light emitting elements ED are disposed on the electrodes RME1 and RME2, a step of removing the ink sprayed together with the light emitting elements ED may be performed. The step of removing the ink may be performed by drying the ink, but fluid ink may not dry at a uniform rate in the emission area EMA or between the barrier walls BP1 and BP2. The fluid may move due to the difference in the drying rate of the ink. For example, as the ink partially dry, ink located between the barrier walls BP1 and BP2 may move along the shape of the barrier walls BP1 and BP2 or the space shape therebetween. As the barrier walls BP1 and BP2 have a shape extending in the first direction DR1, the ink sprayed therebetween may dry while receiving a force to partially move in the first direction DR1.

However, as in the display device 10 according to one or more embodiments, if the first and second barrier walls BP1 and BP2 have shapes substantially extending in the first direction DR1, in which the distance therebetween varies according to the location, the ink may receive a force to move in the second direction DR2 in addition to the first direction DR1 when they dry. For example, the ink disposed between the first portion P1 of the first barrier wall BP1 and the third portion P3 of the second barrier wall BP2 may receive a force to move in the first direction DR1 along the shape of the barrier walls BP1 and BP2 while it dries. When the ink is located between the second portion P2 and the fourth portion P4 while it moves, it may receive a force to move in the second direction DR2 in addition to the first direction DR1 along the shapes of the barrier walls BP1 and BP2.

While the ink moves by the force, the light emitting elements ED dispersed in the ink may also receive the force. If the light emitting elements ED disposed on the electrodes RME1 and RME2 move by the electric field while the ink dries, the light emitting elements ED may be separated from the initial arrangement location. If the ink receives forces in various directions instead of a limited direction while drying, the movement of the ink can be reduced or minimized, and the separation of the light emitting elements ED from the arrangement location can be reduced. Further, if the light emitting elements ED are disposed on the electrodes RME1 and RME2, they can be fixed without moving even when the ink drying step is performed, and the light emitting elements ED can be prevented from moving and aggregating with each other during the ink drying step. In the display device 10, the light emitting elements ED can be disposed in a substantially uniform distribution between the barrier walls BP1 and BP2, and it is possible to prevent connection defects between the light emitting element ED and the connection electrodes CNE1 and CNE2. The product quality of the display device 10 can be improved.

The light emitting element ED may be disposed between the barrier walls BP1 and BP2 regardless of their shape. For example, the light emitting element ED may include a first type light emitting element ED_A disposed between the first portion P1 of the first barrier wall BP1 and the third portion P3 of the second barrier wall BP2, and a second type light emitting element ED_B disposed between the second portion P2 of the first barrier wall BP1 and the fourth portion P4 of the second barrier wall BP2. The first type light emitting element ED_A and the second type light emitting element ED_B may be arranged at different locations between the barrier walls BP1 and BP2, but may not be guided to be arranged at specific locations due to the distance between the barrier walls BP1 and BP2. The plurality of light emitting elements ED may be arranged along the first direction DR1 with a suitable distance (e.g., a predetermined distance) therebetween, and both ends thereof may be disposed on the first electrode RME1 and the second electrode RME2. The plurality of light emitting elements ED may be divided into the first type light emitting element ED_A and the second type light emitting element ED_B according to the locations in the barrier walls BP1 and BP2.

The light emitting element ED may further include a third type light emitting element ED_C disposed between the first type light emitting element ED_A and the second type light emitting element ED_B. Both ends of the third type light emitting element ED_C may be disposed on the first electrode RME1 and the second electrode RME2. The third type light emitting element ED_C may be parallel with a portion between the first portion P1 and the second portion P2 of the first barrier wall BP1 and a portion between the third portion P3 and the fourth portion P4 of the second barrier wall BP2. The light emitting element ED may not be disposed only in a relatively narrow region or only in a relatively wide region between the barrier walls BP1 and BP2, and may be disposed regardless of the shapes of the barrier walls BP1 and BP2 and the locations in the barrier walls BP1 and BP2 as in the third type light emitting element ED_C.

The length of the light emitting element ED, the distance between the electrodes RME1 and RME2, and the distance between the barrier walls BP1 and BP2 may be designed so that both ends of the light emitting element ED extending in one direction can be placed on the electrodes RME1 and RME2. In one or more embodiments, a length L of the light emitting element ED may be smaller than the distances WD1 and WD2 between the barrier walls BP1 and BP2, but may be greater than a third distance WD3 between the electrodes RME1 and RME2. In order to dispose the light emitting element ED between the barrier walls BP1 and BP2, the light emitting element ED may have the length L that is smaller than the minimum distance therebetween, for example, the first distance WD1 between the first portion P1 and the third portion P3. In the meantime, in order to place the both ends of the light emitting element ED on the electrodes RME1 and RME2, the length L of the light emitting element ED may be greater than the third distance WD3 between the electrodes RME1 and RME2. The third distance WD3 between the electrodes RME1 and RME2 may be smaller than the distances WD1 and WD2 between the barrier walls BP1 and BP2.

The barrier walls BP1 and BP2 have a shape in which the distance between the facing inner sides spaced from each other repeatedly increases and decreases. In contrast, the first electrode RME1 and the second electrode RME2 may be disposed so that portions thereof arranged in the emission area EMA may be parallel with each other. According to one or more embodiments, the portions of the first electrode RME1 and the second electrode RME2 on which the light emitting elements ED are disposed in the emission area EMA may have facing first sides that extend to be parallel with each other. The first side of the first electrode RME1 extends in the first direction DR1, and the first electrode RME1 may cover the inner sides of the first portion P1 and the second portion P2 of the first barrier wall BP1, which face the second barrier wall BP2. The first side of the second electrode RME2 extends in the first direction DR1, and the second electrode RME2 may cover the inner sides of the third portion P3 and the fourth portion P4 of the second barrier wall BP2, which face the first barrier wall BP1. The electrodes RME1 and RME2 may have a shape in which at least the facing inner sides are parallel with each other in the first direction DR1 regardless of the side shapes of the barrier walls BP1 and BP2. As the first sides of the electrodes RME1 and RME2 extend while being parallel with each other, the light emitting elements ED disposed on the electrodes RME1 and RME2 may also be substantially arranged in a line along the first direction DR1 regardless of the shapes of the barrier walls BP1 and BP2.

In one or more embodiments, second sides of the first electrode RME1 and the second electrode RME2, which are opposite to the facing first sides, may also extend to be parallel with each other. While the first sides of the first electrode RME1 and the second electrode RME2 are located inside the facing inner sides of the barrier walls BP1 and BP2, the second sides thereof may be respectively disposed on the barrier walls BP1 and BP2 to extend in the first direction DR1 thereon. The facing first sides of the first electrode RME1 and the second electrode RME2 may not overlap the barrier walls BP1 and BP2, and the opposite second sides thereof may overlap the barrier walls BP1 and BP2. However, the present disclosure is not limited thereto. If the widths of the first electrode RME1 and the second electrode RME2 are formed to be larger, the second sides of the respective electrodes RME1 and RME2 may also be located outside the outer sides of the barrier walls BP1 and BP2, and the second sides of the electrodes RME1 and RME2 may not overlap the barrier walls BP1 and BP2.

As the second sides of the first electrode RME1 and the second electrode RME2 extend in the first direction DR1 on the barrier walls BP1 and BP2, and the second portion P2 and the fourth portion P4 of the barrier walls BP1 and BP2 are formed to be inwardly concave compared to the first portion P1 and the third portion P3 thereof, portions of the first electrode RME1 and the second electrode RME2, which overlap the barrier walls BP1 and BP2, may have varying overlapping areas according to the locations. For example, the area of the overlapping portion between the first electrode RME1 and the first portion P1 may be greater than the area of the overlapping portion between the first electrode RME1 and the second portion P2. The area of the overlapping portion between the second electrode RME2 and the third portion P3 may be greater than the area of the overlapping portion between the second electrode RME2 and the fourth portion P4.

The facing inner sides of the barrier walls BP1 and BP2 may not be parallel with each other, and may have a partially concave shape, while the opposite outer sides thereof may extend to be parallel with each other. According to one or more embodiments, the widths of the barrier walls BP1 and BP2 may vary according to the location, and the shapes of the facing inner sides may be different from those of the opposite outer sides. For example, a width W1 of the first portion P1 of the first barrier wall BP1 may be greater than a width W2 of the second portion P2 thereof. A width of the third portion P3 of the second barrier wall BP2 may be greater than a width of the fourth portion P4 thereof. As the facing inner sides are formed to be partially concave, the barrier walls BP1 and BP2 may have a shape in which the widths thereof decrease at the concave portions. However, the present disclosure is not limited thereto. The portions P1, P2, P3, and P4 of the barrier walls BP1 and BP2 may have the same width, and the opposite outer sides may convexly protrude to correspond to the concave portions of the facing inner sides.

The drawing illustrates that the facing first sides of the electrodes RME1 and RME2 are disposed between the barrier walls BP1 and BP2 while not overlapping them, and the opposite second sides are disposed on the barrier walls BP1 and BP2 while overlapping them. Accordingly, as the barrier walls BP1 and BP2 have widths varying according to the location and have a partially concave shape, areas of the overlapping portions between the electrodes RME1 and RME2 and the barrier walls BP1 and BP2 may vary. However, as described above, when the widths of the electrodes RME1 and RME2 are formed to be larger, the second sides thereof may not overlap the barrier walls BP1 and BP2, and the electrodes RME1 and RME2 may cover the outer sides of the barrier walls BP1 and BP2. In this case, the areas of the overlapping portions between the electrodes RME1 and RME2 and the barrier walls BP1 and BP2 may vary according to the widths of the barrier walls BP1 and BP2. In one or more embodiments in which the widths of the barrier walls BP1 and BP2 vary according to the location as in the embodiment of FIG. 4, the areas of the overlapping portions between the electrodes RME1 and RME2 and the barrier walls BP1 and BP2 may vary according to the location. In one or more embodiments, when the widths of the barrier walls BP1 and BP2 are the same regardless of the location, depending on the widths of the electrodes RME1 and RME2, the areas of the overlapping portions between the electrodes RME1 and RME2 and the barrier walls BP1 and BP2 may be the same regardless of the location.

The connection electrodes CNE1 and CNE2 may be disposed on the electrodes RME1 and RME2 and the barrier walls BP1 and BP2. The first connection electrode CNE1 may be disposed on the first electrode RME1 and the first barrier wall BP1 while partially overlapping them. The second connection electrode CNE2 may be disposed on the second electrode RME2 and the second barrier wall BP2 while partially overlapping them. According to one or more embodiments, regardless of the shapes of the barrier walls BP1 and BP2, the connection electrodes CNE1 and CNE2 may also have sides facing each other and sides opposite thereto that extend to be parallel with each other according to the shapes of the electrodes RME1 and RME2.

The connection electrodes CNE1 and CNE2 may partially overlap the light emitting element ED to be respectively in contact with the first end and the second end of the light emitting element ED. The distance between the first connection electrode CNE1 and the second connection electrode CNE2 may be smaller than the length of the light emitting element ED, and may be smaller than the third distance WD3 between the electrodes RME1 and RME2.

In the display device 10, the electrodes RME1 and RME2 and the connection electrodes CNE1 and CNE2 may extend in one direction, while the barrier walls BP1 and BP2 may include the facing inner sides having partially concave shapes without being parallel with each other. According to the shapes of the barrier walls BP1 and BP2, movement of the light emitting elements ED can be reduced after being disposed on the electrodes RME1 and RME2, and it is possible to prevent aggregation of the light emitting elements ED during the manufacturing process of the display device 10.

Figure 6:
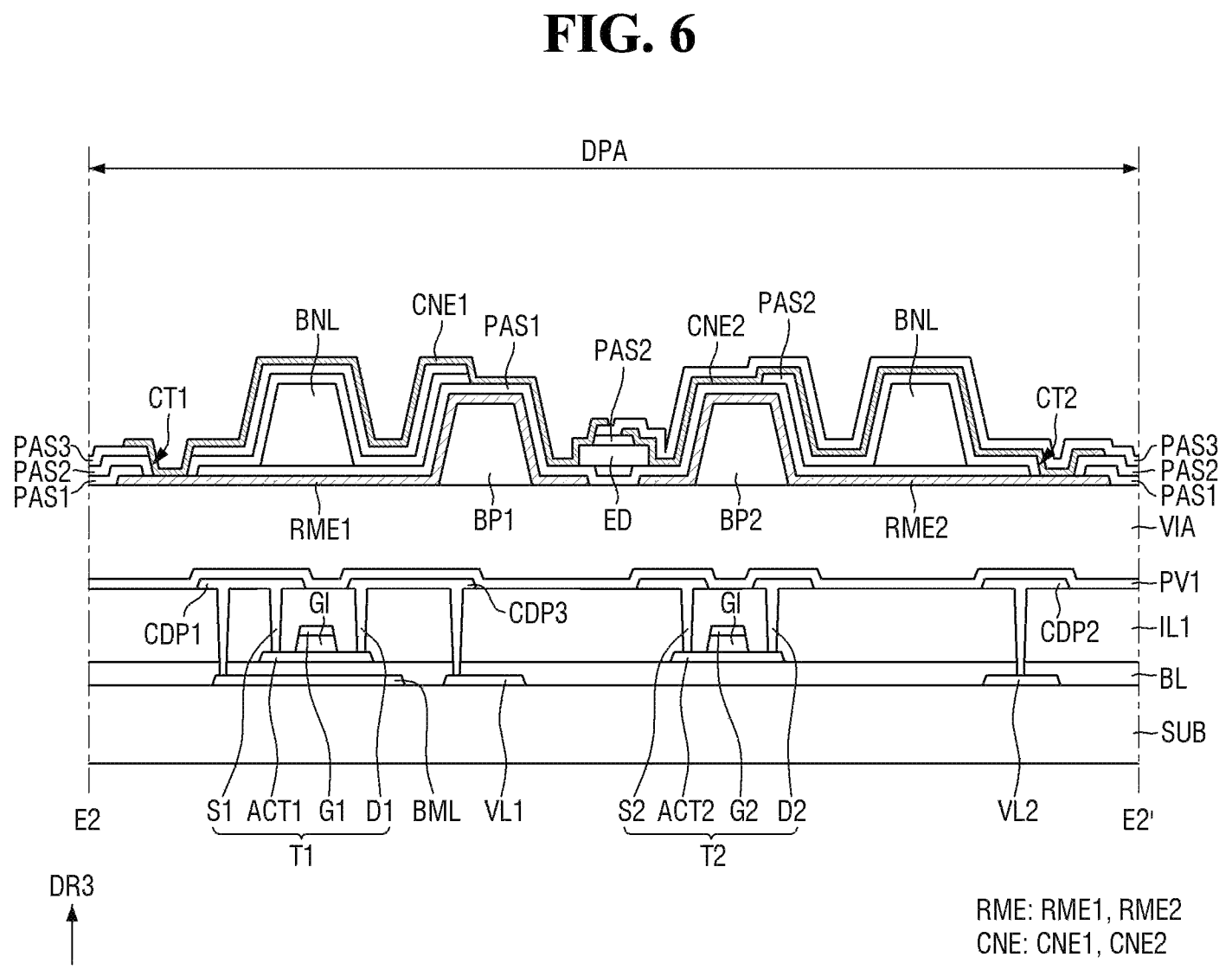
Figure 7:
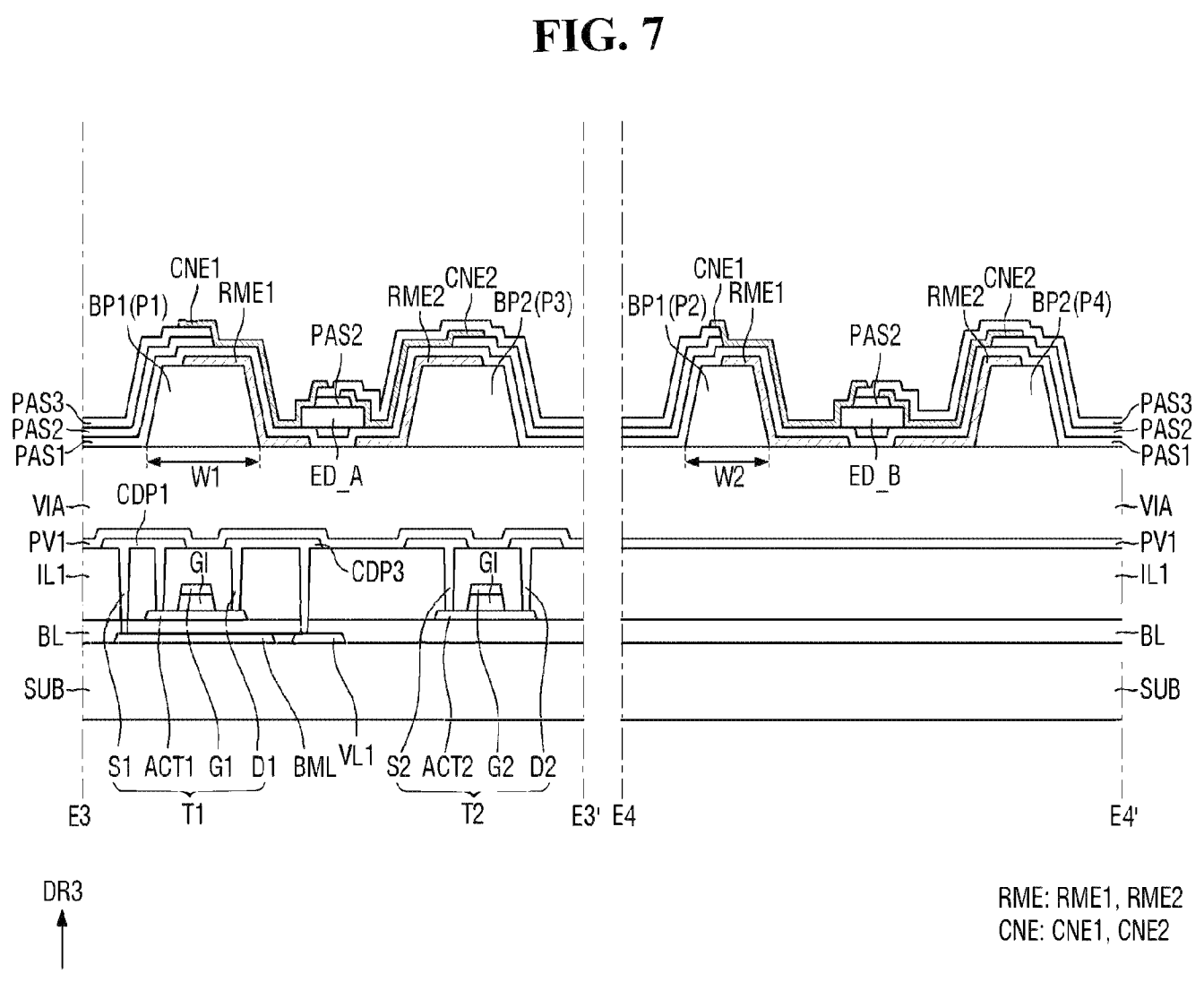
Figure 8:
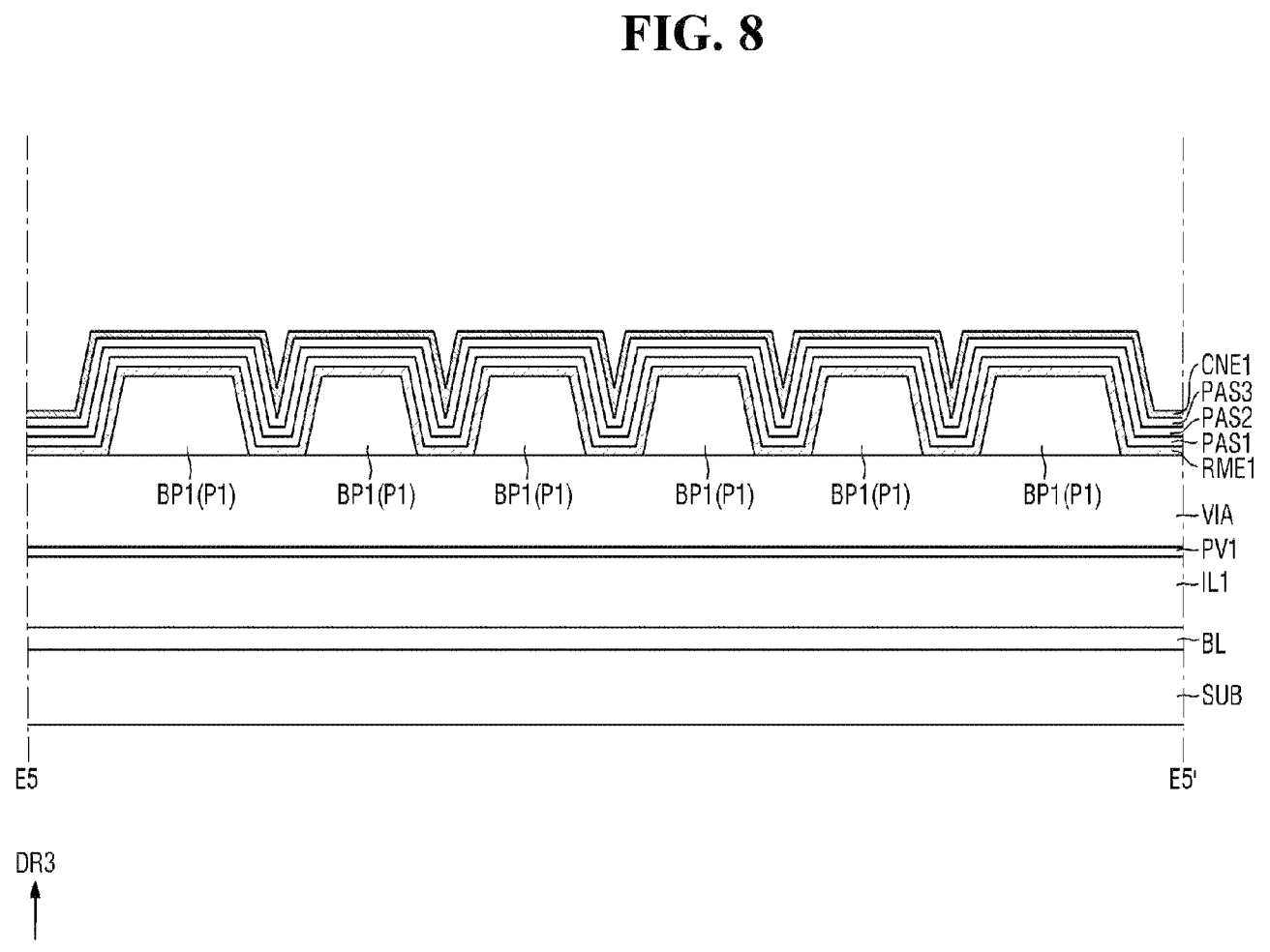

FIG. 5 is a cross-sectional view taken along the line E1-E1' of FIG. 2. FIG. 6 is a cross-sectional view taken along the line E2-E2' of FIG. 2. FIG. 7 is a cross-sectional view taken along the lines E3-E3' and E4-E4' of FIG. 2. FIG. 8 is a cross-sectional view taken along the line E5-E5' of FIG. 2.

FIG. 5 illustrates a cross section across both ends of the light emitting element ED and electrode contact holes CT1 and CT2 disposed in the first sub-pixel SPX1, and FIG. 6 illustrates a cross section across both ends of the light emitting element ED and contact portions CTD and CTS disposed in the first sub-pixel SPXn. FIG. 7 illustrates, as both ends of the light emitting element ED, a cross section crossing both ends of the light emitting element ED disposed between different portions of the barrier walls BP1 and BP2. FIG. 8 illustrates a cross section crossing the first barrier wall BP1 in the first direction DR1.

The cross-sectional structure of the display device 10 is described with reference to FIGS. 5 to 8 in conjunction with FIGS. 2 to 4. The display device 10 may include a first substrate SUB, and a semiconductor layer, a plurality of conductive layers, and a plurality of insulating layers disposed thereon. In addition, the display device 10 may include the plurality of electrodes RME (RME1 and RME2), the light emitting element ED, and the connection electrodes CNE (CNE1 and CNE2). The semiconductor layer, the conductive layers, and the insulating layers may each constitute a circuit layer of the display device 10.

The first substrate SUB may be an insulating substrate. The first substrate SUB may be made of an insulating material such as glass, quartz, or polymer resin. Further, the first substrate SUB may be a rigid substrate, but may also be a flexible substrate which can be bent, folded, or rolled. The first substrate SUB may include the display area DPA and the non-display area NDA surrounding the display area DPA, and the display area DPA may include the emission area EMA and the sub-region SA that is a part of the non-emission area.

A first conductive layer may be disposed on the first substrate SUB. The first conductive layer may include a lower metal layer BML, a first voltage line VL1, and a second voltage line VL2. The lower metal layer BML may be arranged to overlap an active layer ACT1 of a first transistor T1 in a thickness direction of the first substrate SUB (e.g., a third direction DR3). The lower metal layer BML may prevent light from being incident on the first active layer ACT1 of the first transistor T1 or may be electrically connected to the first active layer ACT1 to perform a function of stabilizing the electrical characteristics of the first transistor T1. However, the lower metal layer BML may be omitted.

The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2. The first voltage line VL1 may be electrically connected to the first transistor T1 via a conductive pattern (e.g., a third conductive pattern CDP3) of a third conductive layer. The second voltage line VL2 may be electrically connected to the second electrode RME2 via a conductive pattern (e.g., a second conductive pattern CDP2) of the third conductive layer.

Although the drawing illustrates that the first voltage line VL1 and the second voltage line VL2 are disposed at a first conductive layer, the present disclosure is not limited thereto. In one or more embodiments, the first voltage line VL1 and the second voltage line VL2 may be disposed at the third conductive layer and may be directly electrically connected to the first transistor T1 and the second electrode RME2, respectively.

A buffer layer BL may be disposed on the first conductive layer and the first substrate SUB. The buffer layer BL may be formed on the first substrate SUB to protect the transistors of the pixel PX from moisture permeating through the first substrate SUB susceptible to moisture permeation, and may perform a surface planarization function.

The semiconductor layer is disposed on the buffer layer BL. The semiconductor layer may include the first active layer ACT1 of the first transistor T1 and a second active layer ACT2 of the second transistor T2. The first active layer ACT1 and the second active layer ACT2 may be disposed to partially overlap a first gate electrode G1 and a second gate electrode G2 of a second conductive layer to be described later, respectively, in the third direction DR3.

The semiconductor layer may include polycrystalline silicon, monocrystalline silicon, oxide semiconductor, and the like. In one or more embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although it is illustrated in the drawing that one first transistor T1 is disposed in the sub-pixel SPXn of the display device 10, but the present disclosure is not limited thereto, and the display device 10 may include a larger number of transistors.

A first gate insulating layer GI is disposed on the semiconductor layer in the display area DPA. The first gate insulating layer GI may serve as a gate insulating layer of each of the transistors T1 and T2. In the drawings, it is illustrated that the first gate insulating layer GI is patterned together with the gate electrodes G1 and G2 of the second conductive layer to be described later, and is partially disposed between the second conductive layer and the active layers ACT1 and ACT2 of the semiconductor layer. However, the present disclosure is not limited thereto. In one or more embodiments, the first gate insulating layer GI may be entirely disposed on the buffer layer BL.

The second conductive layer is disposed on the first gate insulating layer GI. The second conductive layer may include a first gate electrode G1 of the first transistor T1 and a second gate electrode G2 of the second transistor T2. The first gate electrode G1 may be disposed to overlap the channel region of the first active layer ACT1 in the third direction DR3 that is a thickness direction of the first substrate SUB, and the second gate electrode G2 may be disposed to overlap the channel region of the second active layer ACT2 in the third direction DR3 that is the thickness direction of the first substrate SUB. In one or more embodiments, the second conductive layer may further include one electrode of the storage capacitor.

A first interlayer insulating layer IL1 is disposed on the second conductive layer, the semiconductor layer, and the buffer layer BL. The first interlayer insulating layer IL1 may function as an insulating film between the second conductive layer and other layers disposed thereon, and may protect the second conductive layer.

A third conductive layer is disposed on the first interlayer insulating layer IL1. The third conductive layer may include a plurality of conductive patterns CDP1, CDP2, and CDP3, and source electrodes S1 and S2 and drain electrodes D1 and D2 of the respective transistors T1 and T2. Some of the conductive patterns CDP1, CDP2, and CDP3 may electrically connect conductive layers or semiconductor layers of different layers to each other and may serve as source/drain electrodes of the transistors T1 and T2.

The first conductive pattern CDP1 may be in contact with the first active layer ACT1 of the first transistor T1 through the contact hole penetrating the first interlayer insulating layer IL1. The first conductive pattern CDP1 may be in contact with the lower metal layer BML through a contact hole penetrating the first interlayer insulating layer IL1 and the buffer layer BL. The first conductive pattern CDP1 may serve as a first source electrode S1 of the first transistor T1. The first conductive pattern CDP1 may be electrically connected to the first electrode RME1 or the first connection electrode CNE1. The first transistor T1 may transmit the first power voltage applied from the first voltage line VL1 to the first electrode RME1 or the first connection electrode CNE1.

The second conductive pattern CDP2 may be in contact with the second voltage line VL2 through a contact hole penetrating the first interlayer insulating layer IL1 and the buffer layer BL. The second conductive pattern CDP2 may be electrically connected to the second electrode RME2 or the second connection electrode CNE2. The second voltage line VL2 may transmit the second power voltage to the second electrode RME2 or the second connection electrode CNE2.

The third conductive pattern CDP3 may be in contact with the first voltage line VL1 through a contact hole penetrating the first interlayer insulating layer IL1 and the buffer layer BL. Further, the third conductive pattern CDP3 may be in contact with the first active layer ACT1 of the first transistor T1 through the contact hole penetrating the first interlayer insulating layer IL1. The third conductive pattern CDP3 may electrically connect the first voltage line VL1 to the first transistor T1 and may serve as the first drain electrode D1 of the first transistor T1.

The second source electrode S2 and the second drain electrode D2 may be in contact with the second active layer ACT2 of the second transistor T2 through the contact holes penetrating the first interlayer insulating layer IL1. The second transistor T2 may transmit a data signal to the first transistor T1 or transmit an initialization signal.

A first passivation layer PV1 is disposed on the third conductive layer and the first interlayer insulating layer IL1. The first passivation layer PV1 may function as an insulating layer between the third conductive layer and other layers and may protect the third conductive layer.

The buffer layer BL, the first gate insulating layer GI, the first interlayer insulating layer IL1, and the first passivation layer PV1 described above may be formed of a plurality of inorganic layers stacked in an alternating manner. For example, the buffer layer BL, the first gate insulating layer GI, the first interlayer insulating layer IL1, and the first passivation layer PV1 may be formed as a double layer formed by stacking, or a multilayer formed by alternately stacking, inorganic layers including at least one of silicon oxide ($SiO_x$), silicon nitride ($SiN_x$), or silicon oxynitride ($SiO_xN_y$). However, the present disclosure is not limited thereto, and the buffer layer BL, the first gate insulating layer GI, the first interlayer insulating layer IL1, and the first passivation layer PV1 may be formed as a single inorganic layer containing the above-described insulating material. Further, in one or more embodiments, the first interlayer insulating layer IL1 may be made of an organic insulating material such as polyimide (PI) or the like.

A via layer VIA is disposed on the third conductive layer and the first passivation layer PV1 in the display area DPA. The via layer VIA may contain an organic insulating material, e.g., polyimide (PI), and may compensate the stepped portion formed by the conductive layers disposed thereunder to flatten the top surface. However, in one or more embodiments, the via layer VIA may be omitted.

The display device 10 may include, as a display element layer disposed on the via layer VIA, the barrier walls BP1 and BP2, the plurality of electrodes RME (RME1 and RME2), the bank layer BNL, the plurality of light emitting elements ED, and the plurality of connection electrodes CNE (CNE1 and CNE2). In addition, the display device 10 may include the insulating layers PAS1, PAS2, and PAS3 disposed on the via layer VIA.

The plurality of barrier walls BP1 and BP2 may be disposed on the via layer VIA. For example, the barrier walls BP1 and BP2 may be directly disposed on the via layer VIA, and may have a structure in which at least a portion thereof protrudes with respect to the top surface of the via layer VIA. The protruding portions of the barrier walls BP1 and BP2 may have an inclined surface or a curved surface with a certain curvature, and the light emitted from the light emitting element ED may be reflected by the electrode RME disposed on the barrier walls BP1 and BP2 and emitted in the upward direction of the via layer VIA. Unlike the example illustrated in the drawing, the barrier walls BP1 and BP2 may have a shape, e.g., a semicircular or semi-elliptical shape, in which the outer surface is curved with a certain curvature in cross-sectional view. The barrier walls BP1 and BP2 may include an organic insulating material such as polyimide (PI), but is not limited thereto.

According to one or more embodiments, each of the barrier walls BP1 and BP2 may include portions having different widths, and a distance between the barrier walls BP1 and BP2 may vary according to a location. For example, as shown in FIGS. 4 and 7, the width W1 of the first portion P1 of the first barrier wall BP1 and the third portion P3 of the second barrier wall BP2 may be greater than the width W2 of the second portion P2 of the first barrier wall BP1 and the fourth portion P4 of the second barrier wall BP2. As the facing inner sides of the barrier walls BP1 and BP2 are formed to be partially concave, and the opposite outer sides thereof extend to be parallel with each other, the distances therebetween may be different from each other. The distance between the first portion P1 and the third portion P3 may be smaller than the distance between the second portion P2 and the fourth portion P4. The first type light emitting element ED_A disposed between the first portion P1 and the third portion P3 may be disposed to be closer to the first barrier wall BP1 and the second barrier wall BP2 than the second type light emitting element ED_B disposed between the second portion P2 and the fourth portion P4. A distance between the first type light emitting element ED_A and the first or second barrier wall BP1 or BP2 may be smaller than a distance between the second type light emitting element ED_B and the first or second barrier wall BP1 or BP2.

The plurality of electrodes RME (RME1 and RME2) may be disposed on the barrier walls BP1 and BP2 and the via layer VIA. For example, the first electrode RME1 and the second electrode RME2 may be arranged at least on the inclined surfaces of the barrier walls BP1 and BP2. The widths of the plurality of electrodes RME measured in the second direction DR2 may be smaller than the widths of the barrier walls BP1 and BP2 measured in the second direction DR2, and the gap between the first electrode RME1 and the second electrode RME2 in the second direction DR2 may be smaller than the gap between the barrier walls BP1 and BP2. At least a part of the first electrode RME1 and the second electrode RME2 may be directly arranged on the via layer VIA, so that the first electrode RME1 and the second electrode RME2 may be arranged on (or at) the same plane.

The light emitting element ED disposed between the barrier walls BP1 and BP2 may emit light toward both ends, and the emitted light may be directed toward the electrodes RME disposed on the barrier walls BP1 and BP2. The electrodes RME may have a structure in which portions thereof disposed on the barrier walls BP1 and BP2 may reflect the light emitted from the light emitting element ED. The first electrode RME1 and the second electrode RME2 may be arranged to cover at least one side surfaces of the barrier walls BP1 and BP2 and may reflect the light emitted from the light emitting element ED.

The electrodes RME may be in direct contact with the third conductive layer through the electrode contact holes CTD and CTS at the portions overlapping the bank layer BNL between the emission area EMA and the sub-region SA. The first electrode contact hole CTD may be formed in an area in which the bank layer BNL and the first electrode RME1 overlap, and the second electrode contact hole CTS may be formed in an area in which the bank layer BNL and the second electrode RME2 overlap. The first electrode RME1 may be in contact with the first conductive pattern CDP1 through the first electrode contact hole CTD penetrating the via layer VIA and the first passivation layer PV1. The second electrode RME2 may be in contact with the second voltage line VL2 through the second electrode contact hole CTS penetrating the via layer VIA and the first passivation layer PV1. The first electrode RME1 may be electrically connected to the first transistor T1 through the first conductive pattern CDP1, so that the first power voltage may be applied to the first electrode RME1, and the second electrode RME2 may be electrically connected to the second voltage line VL2 though the second conductive pattern CDP2, so that the second power voltage may be applied to the second electrode RME2. However, the present disclosure is not limited thereto. In one or more embodiments, the electrodes RME1 and RME2 may not be electrically connected to the voltage lines VL1 and VL2 of the first conductive layer, respectively, and the connection electrode CNE to be described later may be directly connected to the third conductive layer.

The plurality of electrodes RME may include a conductive material having high reflectivity. For example, the electrodes RME may contain a metal such as silver (Ag), copper (Cu), or aluminum (Al), or may contain an alloy including aluminum (Al), nickel (Ni), lanthanum (La), or the like. Alternatively, the electrodes RME may have a structure in which a metal layer such as titanium (Ti), molybdenum (Mo), and niobium (Nb) and the alloy are stacked. In one or more embodiments, the electrodes RME may be formed as a double layer or a multilayer formed by stacking at least one metal layer made of an alloy including aluminum (Al) and titanium (Ti), molybdenum (Mo), and niobium (Nb).

The present disclosure is not limited thereto, and each electrode RME may further include a transparent conductive material. For example, each electrode RME may include a material such as ITO, IZO, and ITZO. In one or more embodiments, each of the electrodes RME may have a structure in which at least one transparent conductive material and at least one metal layer having high reflectivity are stacked, or may be formed as one layer including them. For example, each electrode RME may have a stacked structure of ITO/Ag/ITO, ITO/Ag/IZO, ITO/Ag/ITZO/IZO, or the like. The electrodes RME may be electrically connected to the light emitting element ED, and may reflect some of the lights emitted from the light emitting element ED in an upward direction of the first substrate SUB.

The first insulating layer PAS1 may be disposed in the entire display area DPA and may be disposed on the via layer VIA and the plurality of electrodes RME. The first insulating layer PAS1 may include an insulating material to protect the plurality of electrodes RME and insulate electrodes RME that are different from each other. The first insulating layer PAS1 is disposed to cover the electrodes RME before the bank layer BNL is formed, so that it is possible to prevent the electrodes RME from being damaged in a process of forming the bank layer BNL. In addition, the first insulating layer PAS1 may prevent the light emitting element ED disposed thereon from being damaged by direct contact with other members.

In one or more embodiments, the first insulating layer PAS1 may have stepped portions such that the top surface thereof is partially depressed between the electrodes RME that are spaced in the second direction DR2. The light emitting element ED may be disposed on the top surface of the first insulating layer PAS1, where the stepped portions are formed, and thus a space may remain between the light emitting element ED and the first insulating layer PAS1.

The first insulating layer PAS1 may include contact portions CT1 and CT2 disposed in the sub-region SA. The contact portions CT1 and CT2 may be disposed to overlap different electrodes RME, respectively. For example, the contact portions CT1 and CT2 may include first contact portions CT1 disposed to overlap the first electrode RME1 and second contact portions CT2 disposed to overlap the second electrode RME2. The first contact portions CT1 and the second contact portions CT2 may penetrate the first insulating layer PAS1 to partially expose the top surface of the first electrode RME1 or the second electrode RME2 thereunder. Each of the first contact portion CT1 and the second contact portion CT2 may further penetrate some of the other insulating layers disposed on the first insulating layer PAS1. The electrode RME exposed by each of the contact portions CT1 and CT2 may be in contact with the connection electrode CNE.

The bank layer BNL may be disposed on the first insulating layer PAS1. The bank layer BNL may include portions extending in the first direction DR1 and the second direction DR2, and may be around (e.g., may surround) the sub-pixels SPXn. The bank layer BNL may be around (e.g., may surround) and distinguish the emission area EMA and the sub-region SA of each sub-pixel SPXn, and may be around (e.g., may surround) the outermost part of the display area DPA and distinguish the display area DPA and the non-display area NDA.

Similar to the barrier walls BP1 and BP2, the bank layer BNL may have a certain height. In one or more embodiments, the top surface of the bank layer BNL may be higher than that of the barrier walls BP1 and BP2, and the thickness of the bank layer BNL may be equal to or greater than that of the barrier walls BP1 and BP2. However, unlike the barrier walls BP1 and BP2, both sides of the bank layer BNL in the extension direction may extend to be substantially parallel with each other, and may not have concave portions. The bank layer BNL may prevent the ink from overflowing to adjacent sub-pixels SPXn in an inkjet printing process during the manufacturing process of the display device 10. Similar to the barrier walls BP1 and BP2, the bank layer BNL may include an organic insulating material such as polyimide.

The plurality of light emitting elements ED may be arranged in the emission area EMA. The light emitting elements ED may be disposed on the first insulating layer PAS1 between the barrier walls BP1 and BP2. The light emitting element ED may be disposed so that one extension direction thereof is parallel with the top surface of the first substrate SUB. As will be described later, the light emitting element ED may include a plurality of semiconductor layers arranged along one direction in which the light emitting element ED extends, and the plurality of semiconductor layers may be sequentially arranged along the direction parallel with the top surface of the first substrate SUB. However, the present disclosure is not limited thereto, and the plurality of semiconductor layers may be arranged in the direction perpendicular to the first substrate SUB when the light emitting element ED has another structure.

The light emitting elements ED disposed in each sub-pixel SPXn may emit light of different wavelength bands depending on a material constituting the semiconductor layer. However, the present disclosure is not limited thereto, and the light emitting elements ED arranged in each sub-pixel SPXn may include the semiconductor layer of the same material and emit light of the same color.

The light emitting elements ED may be electrically connected to the electrode RME and the conductive layers below the via layer VIA while being in contact with the connection electrodes CNE (CNE1 and CNE2), and may emit light of a specific wavelength band by receiving an electrical signal.

The second insulating layer PAS2 may be disposed on the plurality of light emitting elements ED, the first insulating layer PAS1, and the bank layer BNL. The second insulating layer PAS2 may include a pattern portion disposed on the plurality of light emitting elements ED while extending in the first direction DR1 between the barrier walls BP1 and BP2. The pattern portion is disposed to partially surround the outer surface of the light emitting element ED, and may not cover both sides or both ends of the light emitting element ED. The pattern portion may form a linear or island-like pattern in each sub-pixel SPXn in a plan view. The pattern portion of the second insulating layer PAS2 may protect the light emitting element ED and fix the light emitting elements ED during a manufacturing process of the display device 10. Further, the second insulating layer PAS2 may be disposed to fill the space between the light emitting element ED and the first insulating layer PAS1 thereunder. Further, a part of the second insulating layer PAS2 may be disposed on the bank layer BNL and in the sub-regions SA.

The second insulating layer PAS2 may include the contact portions CT1 and CT2 disposed in the sub-region SA. The second insulating layer PAS2 may include the first contact portion CT1 disposed to overlap the first electrode RME1, and the second contact portion CT2 disposed to overlap the second electrode RME2. The contact portions CT1 and CT2 may penetrate the second insulating layer PAS2 in addition to the first insulating layer PAS1. The plurality of first contact portions CT1 and the plurality of second contact portions CT2 may partially expose the top surface of the first electrode RME1 or the second electrode RME2 disposed thereunder.

The plurality of connection electrodes CNE (CNE1 and CNE2) may be disposed on the plurality of electrodes RME and the barrier walls BP1 and BP2. The first connection electrode CNE1 may be disposed on the first electrode RME1 and the first barrier wall BP1. The first connection electrode CNE1 may partially overlap the first electrode RME1 and may be disposed across the emission area EMA and the sub-region SA over the bank layer BNL. The second connection electrode CNE2 may be disposed on the second electrode RME2 and the second barrier wall BP2. The second connection electrode CNE2 may partially overlap the second electrode RME2 and may be disposed across the emission area EMA and the sub-region SA over the bank layer BNL.

Each of the first connection electrode CNE1 and the second connection electrode CNE2 may be disposed on the second insulating layer PAS2 and may be in contact with the light emitting elements ED. The first connection electrode CNE1 may partially overlap the first electrode RME1 and may be in contact with one ends of the light emitting elements ED. The second connection electrode CNE2 may partially overlap the second electrode RME2 and may be in contact with the other ends of the light emitting elements ED. The plurality of connection electrodes CNE are disposed across the emission area EMA and the sub-region SA. The connection electrodes CNE may be in contact with the light emitting elements ED at portions disposed in the emission area EMA, and may be electrically connected to the third conductive layer at portions disposed in the sub-region SA. The first connection electrode CNE1 may be in contact with a first end of the light emitting element ED, and the second connection electrode CNE2 may be in contact with a second end of the light emitting element ED.

In accordance with one or more embodiments, in the display device 10, the connection electrodes CNE may be in contact with the electrode RME through the contact portions CT1 and CT2 disposed in the sub-region SA. The first connection electrode CNE1 may be in contract with the first electrode RME1 through the first contact portion CT1 penetrating the first insulating layer PAS1, the second insulating layer PAS2, and the third insulating layer PAS3 in the sub-region SA. The second connection electrode CNE2 may be in contact with the second electrode RME2 through the second contact portion CT2 penetrating the first insulating layer PAS1 and the second insulating layer PAS2 in the sub-region SA. Each of the connection electrodes CNE may be electrically connected to the third conductive layer through each of electrodes RME. The first connection electrode CNE1 may be electrically connected to the first transistor T1, so that the first power voltage may be applied to the first connection electrode CNE1, and the second connection electrode CNE2 may be electrically connected to the second voltage line VL2, so that the second power voltage may be applied to the second connection electrode CNE2. Each connection electrode CNE may be in contact with the light emitting element ED in the emission area EMA to transmit the power voltage to the light emitting element ED.

However, the present disclosure is not limited thereto. In one or more embodiments, the plurality of connection electrodes CNE may be in direct contact with the third conductive layer, and may be electrically connected to the third conductive layer through patterns other than the electrodes RME.

The connection electrodes CNE may include a conductive material. For example, they may include ITO, IZO, ITZO, aluminum (Al), or the like. As an example, the connection electrodes CNE may include a transparent conductive material, and light emitted from the light emitting element ED may pass through the connection electrodes CNE to be emitted.

The third insulating layer PAS3 is disposed on the second connection electrode CNE2 and the second insulating layer PAS2 of the first connection electrode layer. The third insulating layer PAS3 may be disposed on the entire second insulating layer PAS2 to cover the second connection electrode CNE2, and the first connection electrode CNE1 of the second connection electrode layer may be disposed on the third insulating layer PAS3. The third insulating layer PAS3 may insulate the first connection electrode CNE1 and the second connection electrode CNE2 to prevent direct contact therebetween.

The third insulating layer PAS3 may include the first contact portions CT1 disposed in the sub-region SA. The first contact portion CT1 may penetrate the third insulating layer PAS3 in addition to the first insulating layer PAS1 and the second insulating layer PAS2. The plurality of first contact portions CT1 may partially expose the top surface of the first electrode RME1 disposed thereunder.

In one or more embodiments, another insulating layer may be further disposed on the third insulating layer PAS3 and the first connection electrode CNE1. The insulating layer may function to protect the members disposed on the first substrate SUB against the external environment.

Each of the first insulating layer PAS1, the second insulating layer PAS2, and the third insulating layer PAS3 described above may include an inorganic insulating material or an organic insulating material. For example, each of the first insulating layer PAS1, the second insulating layer PAS2, and the third insulating layer PAS3 may include an inorganic insulating material. Alternatively, the first insulating layer PAS1 and the third insulating layer PAS3 may include an inorganic insulating material, whereas the second insulating layer PAS2 may include an organic insulating material. Each or at least one of the first insulating layer PAS1, the second insulating layer PAS2, and the third insulating layer PAS3 may have a structure in which a plurality of insulating layers is stacked alternately or repeatedly. In one or more embodiments, each of the first insulating layer PAS1, the second insulating layer PAS2, and the third insulating layer PAS3 may be any one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of the same material or different materials. Alternatively, some of them may be made of the same material and some of them may be made of different materials.

Figure 9:
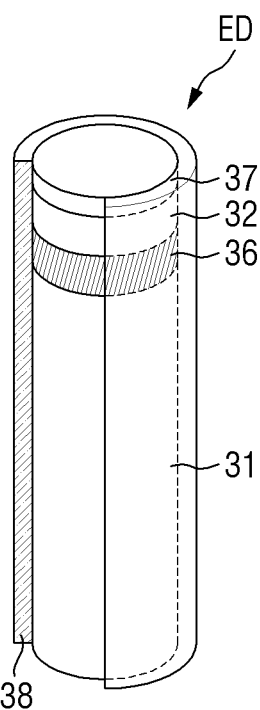
FIG. 9 is a schematic diagram illustrating a cutaway view of a light emitting element according to one or more embodiments.

FIG. 9 is a schematic diagram of a cutaway view of a light emitting element according to one or more embodiments.

Referring to FIG. 9, the light emitting element ED may be a light emitting diode. For example, the light emitting element ED may be an inorganic light emitting diode that has a nanometer or micrometer size, and is made of an inorganic material. The light emitting element ED may be aligned between two electrodes having polarity when an electric field is formed in a specific direction between two electrodes facing each other.

The light emitting element ED according to one or more embodiments may have a shape elongated in one direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in one direction and having an outer surface partially inclined.

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of AlxGayIn1-x-yN ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, Se, or the like.

The second semiconductor layer 32 is disposed on the first semiconductor layer 31 with the light emitting layer 36 therebetween. The second semiconductor layer 32 may be a p-type semiconductor, and the second semiconductor layer 32 may include a semiconductor material having a chemical formula of AlxGayIn1-x-yN ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like.

Although it is illustrated in the drawing that the first semiconductor layer 31 and the second semiconductor layer 32 are configured as one layer, the present disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer. For example, the light emitting element ED may further include another semiconductor layer disposed between the first semiconductor layer 31 and the light emitting layer 36 or between the second semiconductor layer 32 and the light emitting layer 36. A semiconductor layer disposed between the first semiconductor layer 31 and the light emitting layer 36 may be any one or more of AlGaInN, GaN, AlGaN, InGaN, AlN, InN and SLs doped with an n-type dopant, and a semiconductor layer disposed between the second semiconductor layer 32 and the light emitting layer 36 may be any one or more of AlGaInN, GaN, AlGaN, InGaN, AlN, and InN doped with a p-type dopant.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be stacked alternately. The light emitting layer 36 may emit light by coupling of electron-hole pairs according to an electrical signal applied through the first semiconductor layer 31 and the second semiconductor layer 32. The light emitting layer 36 may include a material such as AlGaN, AlGaInN, or InGaN. For example, when the light emitting layer 36 has a multiple quantum well structure in which quantum layers and well layers are alternately stacked, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy are alternately stacked, and may include other Group III to Group V semiconductor materials according to the wavelength band of the emitted light. The light emitted by the light emitting layer 36 is not limited to the light of the blue wavelength band, but the light emitting layer 36 may also emit light of a red or green wavelength band in some cases.

The electrode layer 37 may be an ohmic connection electrode and may be on the second semiconductor layer 32. However, the present disclosure is not limited thereto, and it may be a Schottky connection electrode. The light emitting element ED may include at least one electrode layer 37. The light emitting element ED may include one or more electrode layers 37, but the present disclosure is not limited thereto, and the electrode layer 37 may be omitted.

In the display device 10, when the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 is arranged to be around (e.g., surround) the outer surfaces (e.g., the outer peripheral or circumferential surfaces) of the plurality of semiconductor layers and electrode layers described above. For example, the insulating film 38 may be disposed to be around (e.g., surround) at least the outer surface (e.g., the outer peripheral or circumferential surface) of the light emitting layer 36, and may be formed to expose both ends of the light emitting element ED in the longitudinal direction. Further, in cross-sectional view, the insulating film 38 may have a top surface, which is rounded in a region adjacent to at least one end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). It is illustrated in the drawing that the insulating film 38 is formed as a single layer, but the present disclosure is not limited thereto. In one or more embodiments, the insulating film 38 may be formed in a multilayer structure having a plurality of layers stacked therein.

The insulating film 38 may perform a function of protecting the semiconductor layers and the electrode layer of the light emitting element ED. The insulating film 38 may prevent an electrical short circuit that is likely to occur at the light emitting layer 36 when an electrode to which an electrical signal is transmitted is in direct contact with the light emitting element ED. In addition, the insulating film 38 may prevent or reduce a decrease in luminous efficiency of the light emitting element ED.

Further, the insulating film 38 may have an outer surface that is surface-treated. The light emitting elements ED may be aligned in such a way of spraying the ink in which the light emitting elements ED are dispersed on the electrodes. Here, the surface of the insulating film 38 may be treated to have a hydrophobic property or hydrophilic property in order to keep the light emitting elements ED in the dispersed state without being aggregated with other adjacent light emitting elements ED in the ink.

Hereinafter, various embodiments of the display device 10 will be described with reference to other drawings.

Figure 10:
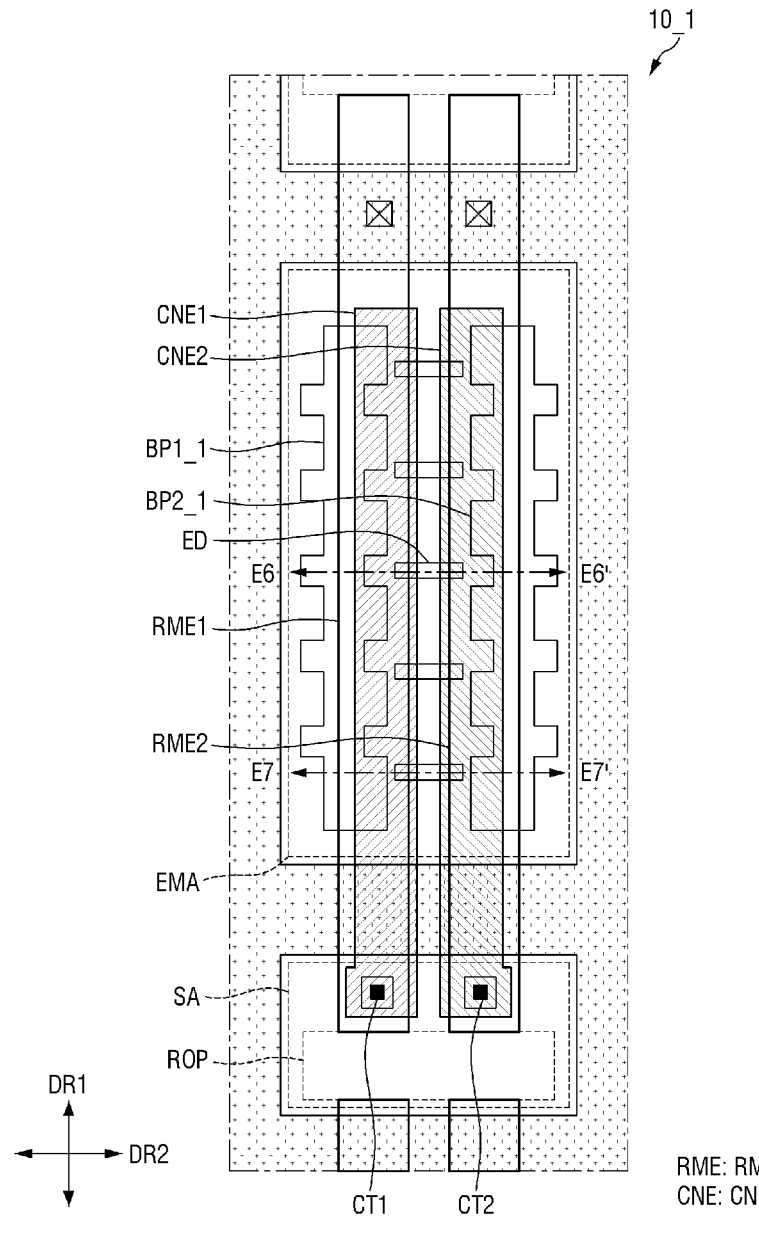
FIG. 10 is a plan view illustrating a sub-pixel of a display device according to one or more embodiments.
Figure 11:
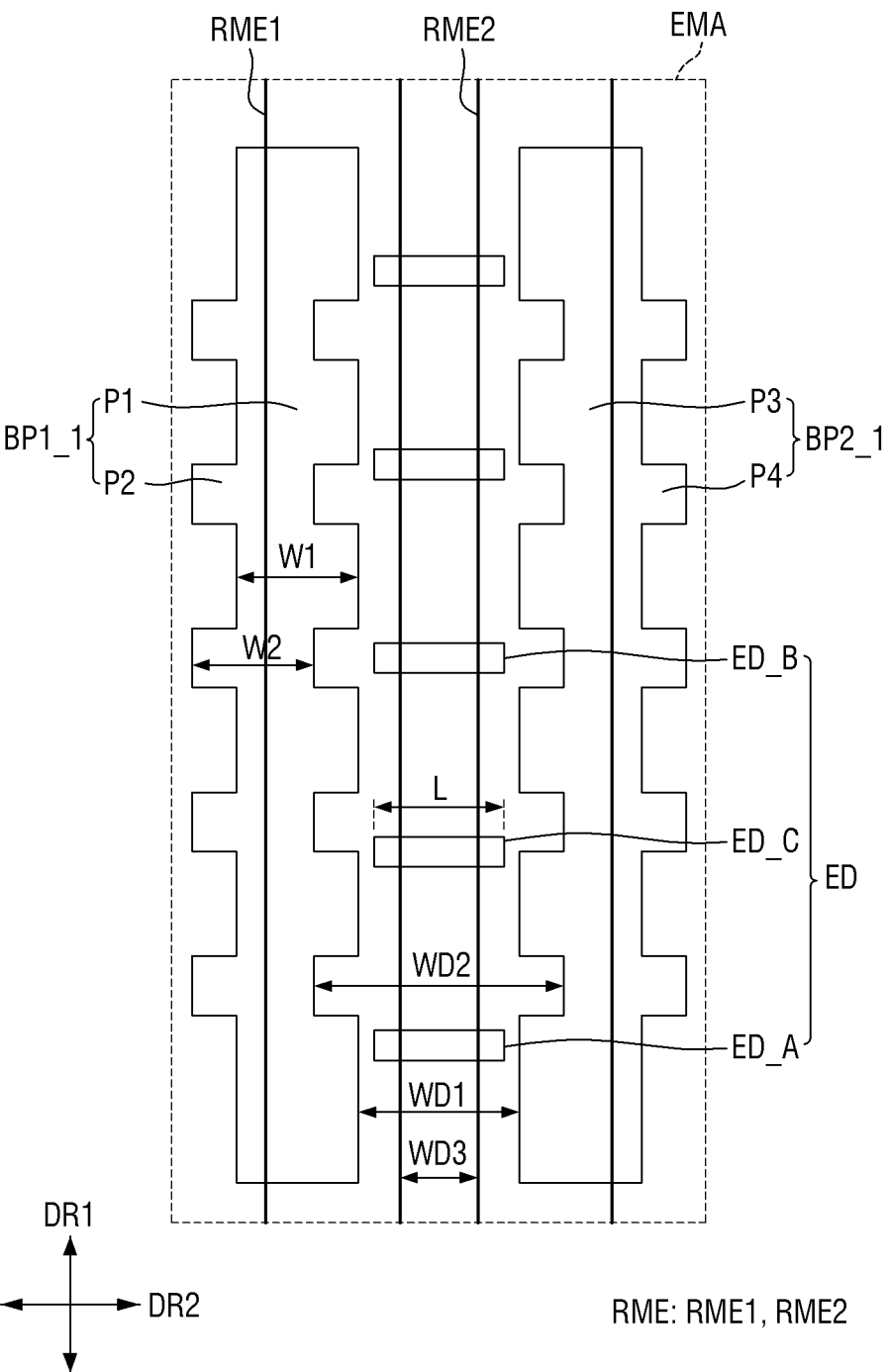
FIG. 11 is a plan view illustrating an arrangement of barrier walls, electrodes, and light emitting elements disposed in an emission area in the display device of FIG. 10.
Figure 12:
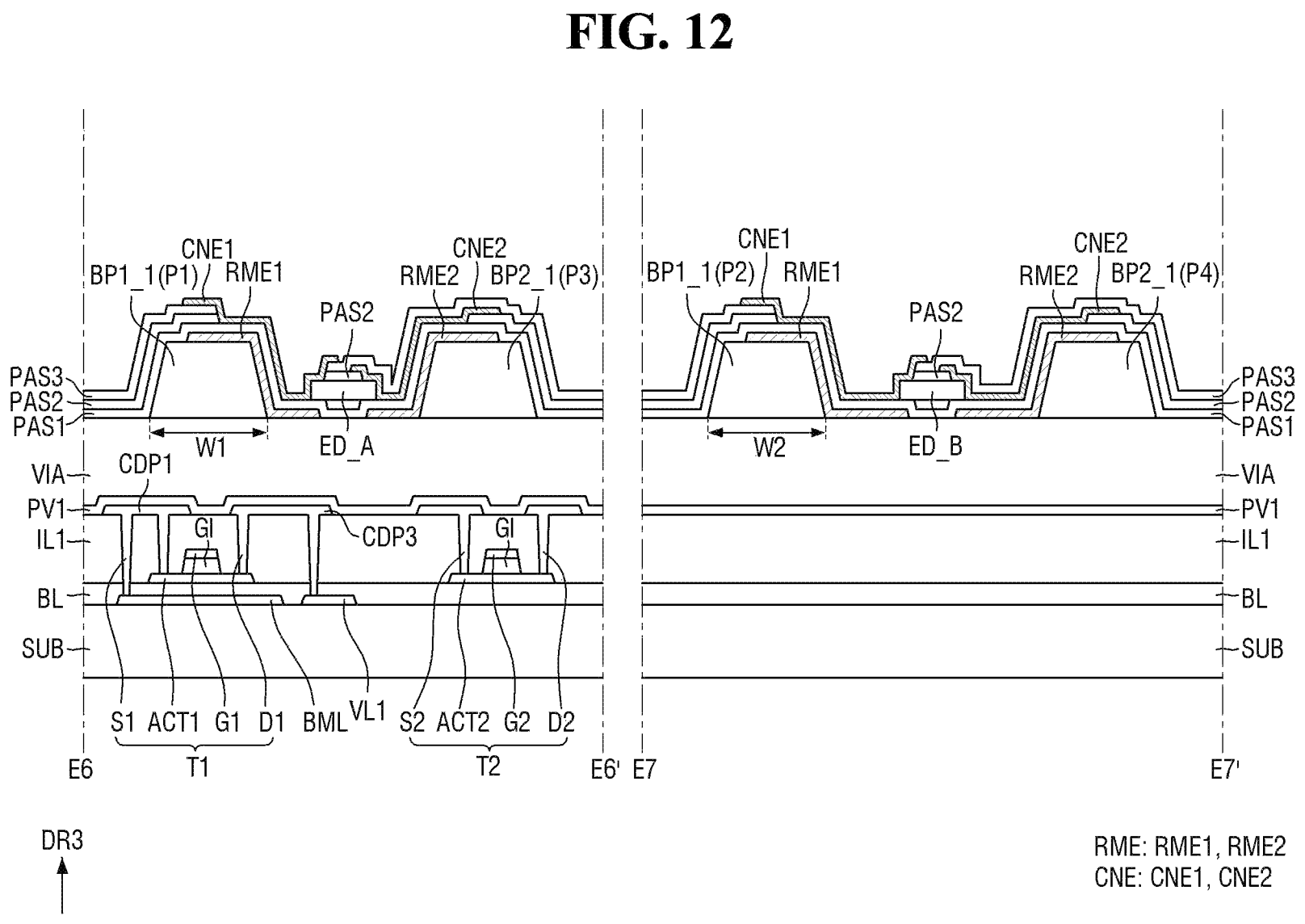

FIG. 10 is a plan view illustrating a sub-pixel of a display device according to one or more embodiments. FIG. 11 is a plan view illustrating an arrangement of barrier walls, electrodes, and light emitting elements disposed in an emission area in the display device of FIG. 10. FIG. 12 is a cross-sectional view taken along the lines E6-E6' and E7-E7' of FIG. 10.

Referring to FIGS. 10 to 12, a display device 10_1 according to one or more embodiments may include a first barrier wall BP1_1 and a second barrier wall BP2_1 whose inner sides facing each other are partially concave not to be parallel with each other, and whose outer sides opposite thereto also partially convexly protrude to correspond thereto. The first barrier wall BP1_1 and the second barrier wall BP2_1 may include the portions P1 and P3 narrowly spaced from each other and the portions P2 and P4 widely spaced from each other, which have the same width.

The first barrier wall BP1_1 may include the first portion P1 and the second portion P2 having the widths W1 and W2 that are the same. The second barrier wall BP2_1 may include the third portion P3 and the fourth portion P4 also having the widths W1 and W2 that are the same. In the barrier walls BP1_1 and BP2_1, the second portion P2 and the fourth portion P4 may include concavely recessed portions of the facing inner sides and convexly protruding portions of the opposite outer sides. The barrier walls BP1_1 and BP2_1 may have a constant width, and the facing inner sides and the opposite outer sides may extend without being parallel with each other.

The first type light emitting element ED_A is a light emitting element arranged between the first portion P1 of the first barrier wall BP1_1 and the third portion P3 of the second barrier wall BP2_1, which are the portions where the distance WD1 between the barrier walls BP1_1 and BP2_1 is relatively small. The second type light emitting element ED_B is a light emitting element arranged between the second portion P2 of the first barrier wall BP1_1 and the fourth portion P4 of the second barrier wall BP2_1, which are the portions where the distance WD2 between the barrier walls BP1_1 and BP2_1 is relatively large. In this case, the first type light emitting element ED_A and the second type light emitting element ED_B may be respectively disposed in portions where the widths of the barrier walls BP1_1 and BP2_1 are the same.

The first electrode RME1 and the second electrode RME2 may have sides facing each other and sides opposite thereto that extend to be parallel with each other in the first direction DR1 regardless of the shapes of the barrier walls BP1_1 and BP2_1. First sides of the electrodes RME1 and RME2 facing each other may be disposed in a region between the barrier walls BP1_1 and BP2_1 while not overlapping them, and second sides thereof opposite to the first sides may be disposed on the barrier walls BP1_1 and BP2_1 while overlapping them. Accordingly, areas of overlapping portions between the electrodes RME1 and RME2 and barrier walls BP1_1 and BP2_1 may vary according to the location. However, when the widths of the electrodes RME1 and RME2 are formed to be larger, the second sides may not overlap the barrier walls BP1_1 and BP2_1 and the electrodes RME1 and RME2 may cover the outer sides of the barrier walls BP1_1 and BP2_1. In such a case, because the widths of the barrier walls BP1_1 and BP2_1 are constant regardless of the location, the areas of the overlapping portions between the electrodes RME1 and RME2 and the barrier walls BP1_1 and BP2_1 may be the same.

Figure 13:
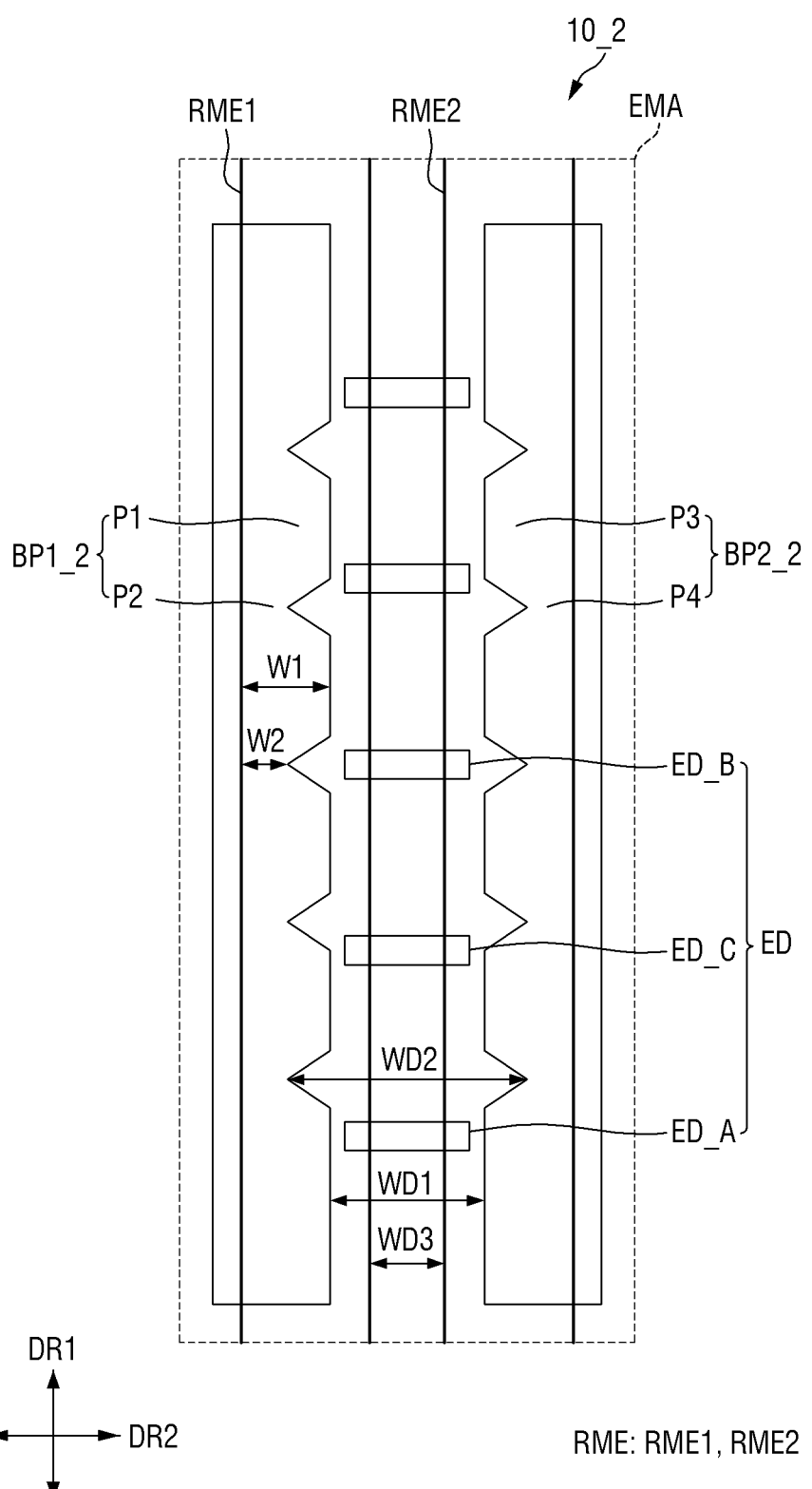
FIG. 13 is a plan view illustrating an arrangement of barrier walls, electrodes, and light emitting elements disposed in an emission area in a display device according to one or more embodiments.

FIG. 13 is a plan view illustrating an arrangement of barrier walls, electrodes, and light emitting elements disposed in an emission area in a display device according to one or more embodiments.

Referring to FIG. 13, a display device 10_2 according to one or more embodiments may include a first barrier wall BP1_2 and a second barrier wall BP2_2 whose inner sides facing each other have a different shape. The second portion P2 and the fourth portion P4, which are concave portions of the respective barrier walls BP1_2 and BP2_2, may include facing inner sides having a shape inclined in a direction between the first direction DR1 and the second direction DR2. This embodiment is different from the embodiment of FIG. 4 in the shapes of the facing inner sides of the barrier walls BP1_2 and BP2_2.

In the above-described embodiments, the second portion P2 of the first barrier wall BP1 may have an inwardly concave (e.g., an inwardly groove shape) shape compared to the first portion P1, and the inner side thereof facing the second barrier wall BP2 may be parallel with the first direction DR1. The distance WD2 between the second portion P2 and the second barrier wall BP2 may be constant at any location of the second portion P2. However, in this embodiment, the facing inner sides of the second portion P2 of the first barrier wall BP1_2 and the fourth portion P4 of the second barrier wall BP2_2 may be formed to be inclined, and the distance between the second portion P2 and the fourth portion P4 may vary according to a location.

For example, the second distance WD2 between the second portion P2 and the fourth portion P4 may be larger than the first distance WD1 between the first portion P1 and the third portion P3, and the distance may gradually increase from the first portion P1 or the third portion P3 toward the center of the second portion P2 or the fourth portion P4. The second distance WD2 between the second portion P2 and the fourth portion P4 may have a maximum value at the center of the second portion P2 and the fourth portion P4, and may gradually decrease therefrom toward the first direction DR1. The width W2 of the second portion P2 and the fourth portion P4 may also have a minimum value at the center thereof and may gradually increase toward the first direction DR1. This embodiment is different from the above-described embodiments in that the structure of the barrier walls BP1_2 and BP2_2 is designed so that the distance is gradually changed in the portion where the distances WD1 and WD2 change between the barrier walls BP1_2 and BP2_2.

In the embodiment of FIG. 13, the outer sides opposite to the facing inner sides of the barrier walls BP1_2 and BP2_2 may be parallel in the first direction DR1. Accordingly, the second portion P2 and the fourth portion P4 may have a shape in which the widths thereof gradually decrease. On the other hand, as in the other embodiment described above, if the outer sides opposite to the facing inner sides of the barrier walls BP1_2 and BP2_2 are not parallel with each other in the first direction DR1, the widths of the second portion P2 and the fourth portion P4 may not be changed.

Figure 14:
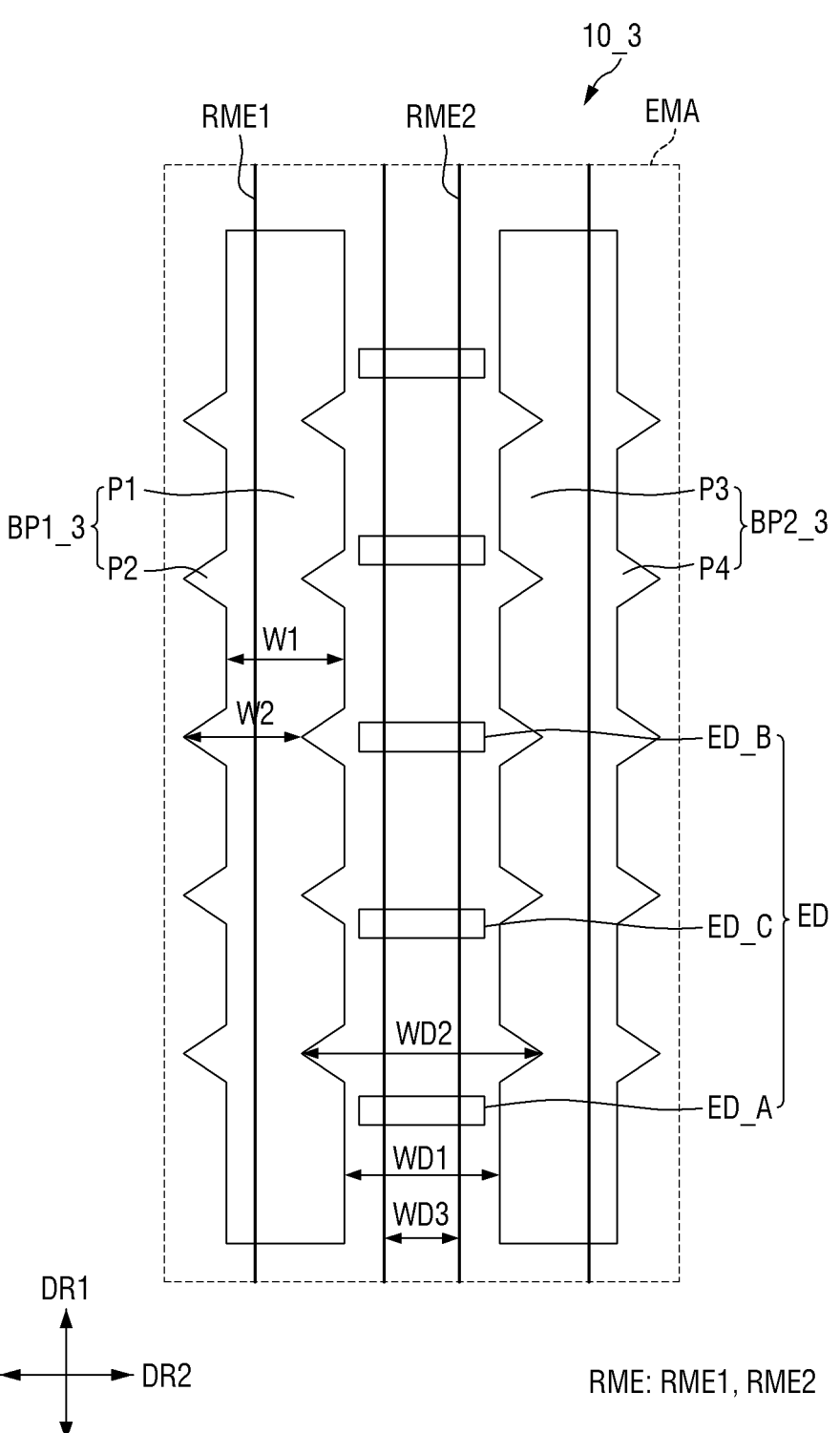
FIG. 14 is a plan view illustrating an arrangement of barrier walls, electrodes, and light emitting elements disposed in an emission area in a display device according to one or more embodiments.

FIG. 14 is a plan view illustrating an arrangement of barrier walls, electrodes, and light emitting elements disposed in an emission area in a display device according to one or more embodiments.

Referring to FIG. 14, a display device 10_3 according to one or more embodiments may include a first barrier wall BP1_3 and a second barrier wall BP2_3 whose inner sides facing each other and outer sides opposite thereto are different in shape. The second portion P2 and the fourth portion P4, which are concave portions of the respective barrier walls BP1_3 and BP2_3, may include the facing inner sides and the opposite outer sides that have a shape inclined in a direction between the first direction DR1 and the second direction DR2. This embodiment is different from the embodiments of FIGS. 4 and 13 in the shapes of the facing inner sides and the opposite outer sides of the barrier walls BP1_3 and BP2_3. In the display device 10_3, the facing inner sides and the opposite outer sides of the barrier walls BP1_3 and BP2_3 may be concavely recessed or convexly protrude, and the concave or convex portion may have an inclined shape. Accordingly, the distance between the barrier walls BP1_3 and BP2_3 may be gradually changed along the first direction DR1, but the widths W1 and W2 of the barrier walls BP1_3 and BP2_3 may be constant regardless of the location. In the following description, redundant description will be omitted.

Figure 15:
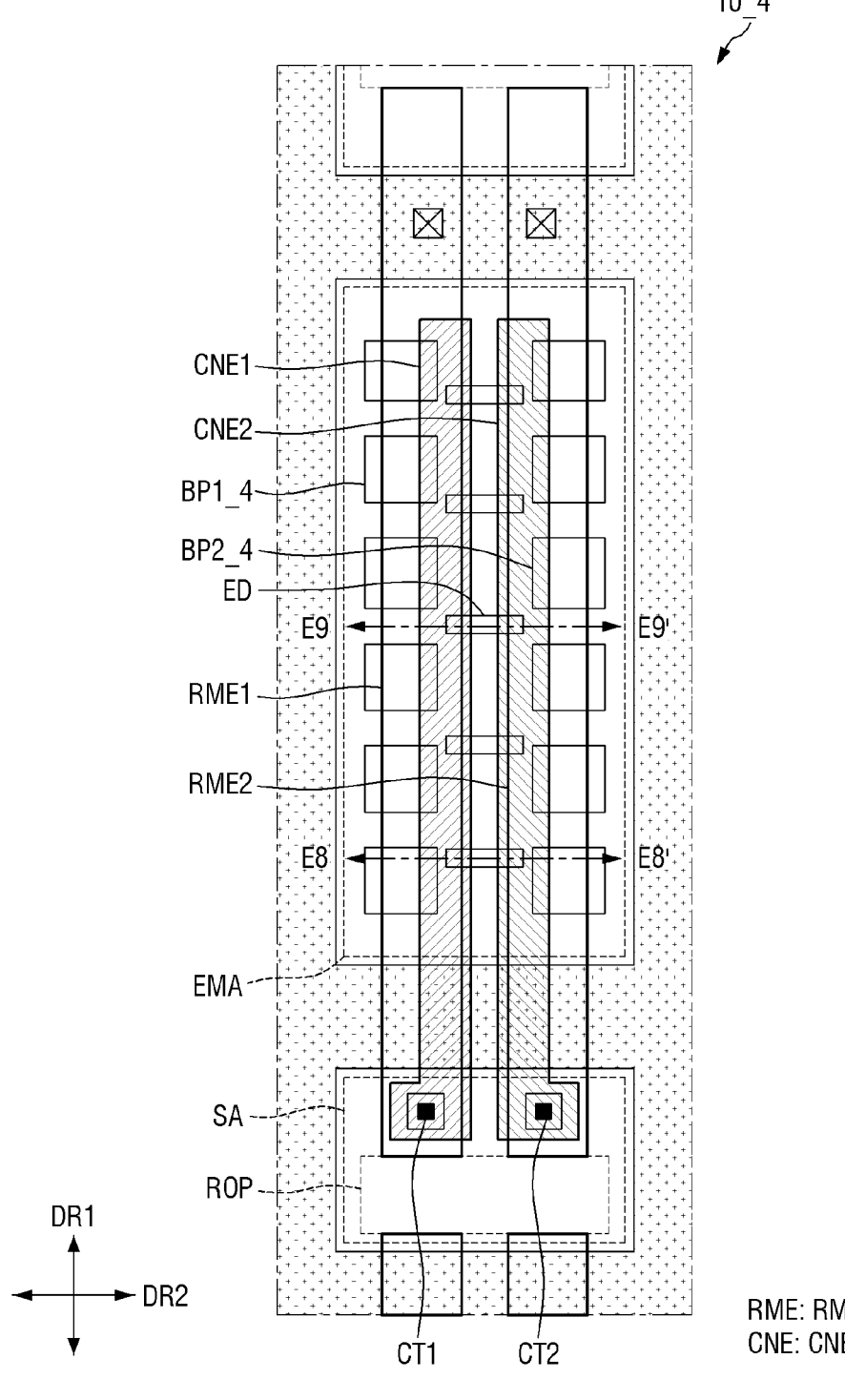
FIG. 15 is a plan view illustrating a sub-pixel of a display device according to one or more embodiments.
Figure 16:
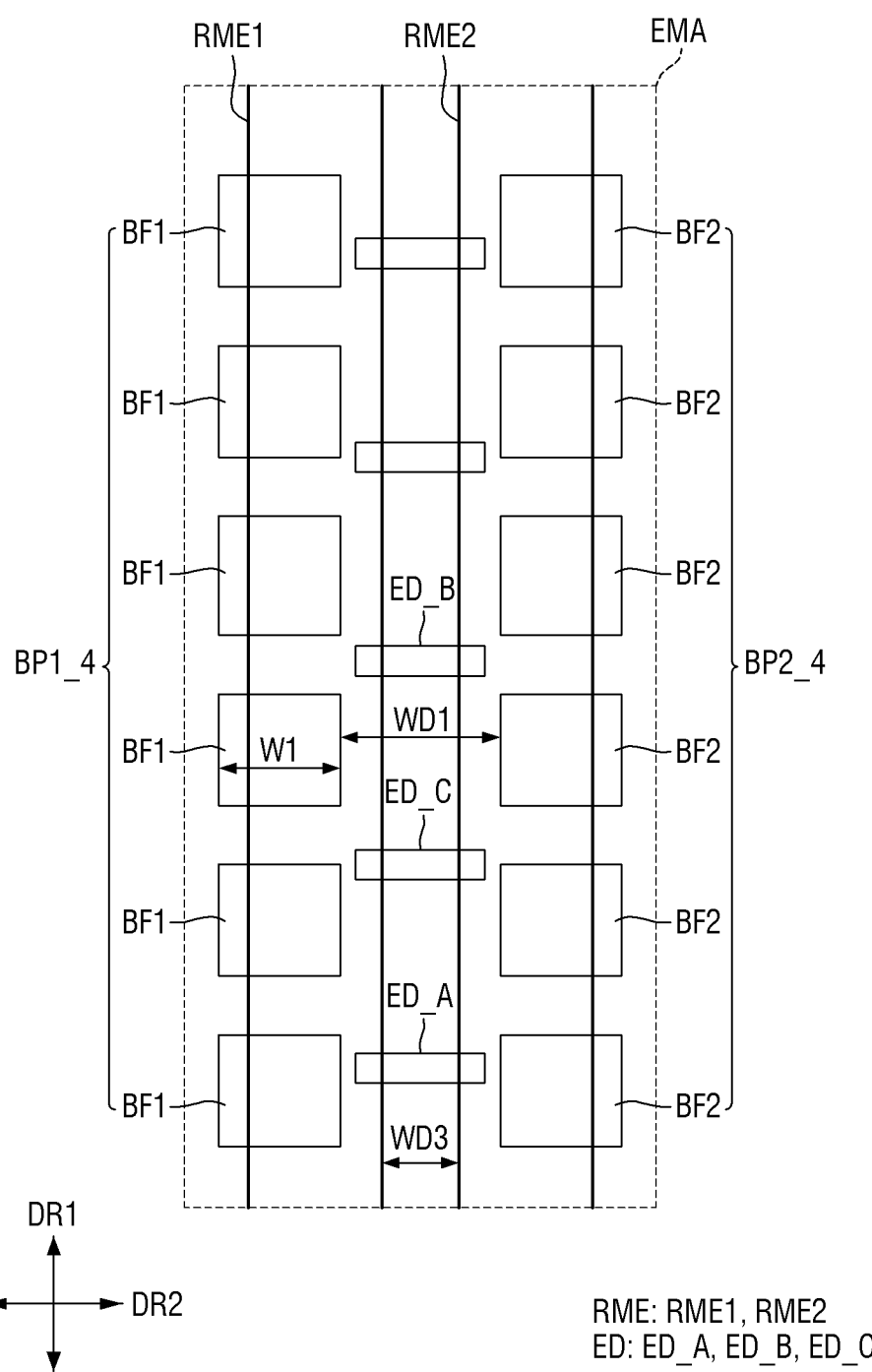
FIG. 16 is a plan view illustrating an arrangement of barrier walls, electrodes, and light emitting elements disposed in an emission area in the display device of FIG. 15.
Figure 17:
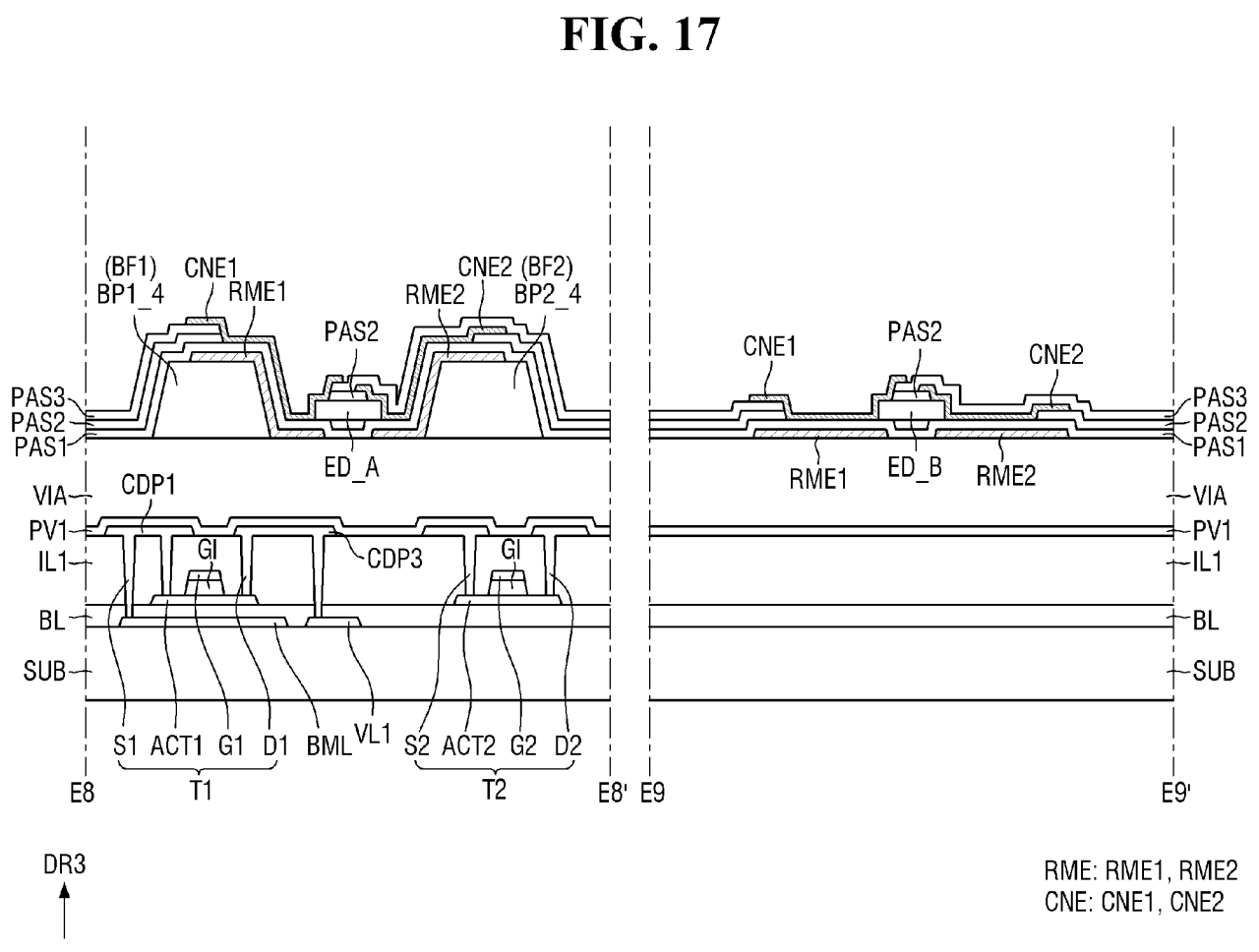

FIG. 15 is a plan view illustrating a sub-pixel of a display device according to one or more embodiments. FIG. 16 is a plan view illustrating an arrangement of barrier walls, electrodes, and light emitting elements disposed in an emission area in the display device of FIG. 15. FIG. 17 is a cross-sectional view taken along the lines E8-E8' and E9-E9' of FIG. 15.

Referring to FIGS. 15 to 17, a display device 10_4 according to one or more embodiments may include barrier walls BP1_4 and BP2_4 which respectively have a plurality of barrier wall patterns BF1 and BF2 spaced from each other. The first barrier wall BP1_4 may include the plurality of first barrier wall patterns BF1 spaced from each other in the first direction DR1. The second barrier wall BP2_4 may include the plurality of second barrier wall patterns BF2 spaced from each other in the first direction DR1. The first barrier wall pattern BF1 and the second barrier wall pattern BF2 may be spaced from each other in the second direction DR2. This embodiment is different from the embodiment of FIG. 4 in that the barrier wall BP1_4 and the barrier wall BP2_4 are divided into the plurality of barrier wall patterns BF1 and the plurality of barrier wall patterns BF2, respectively.

In the manufacturing process of the display device 10_4, when the light emitting element ED is disposed and the ink dries, the ink may move and the light emitting element ED may also move. In this case, the ink may move along the shapes of the barrier walls BP1_4 and BP2_4, and the ink disposed between the barrier walls BP1_4 and BP2_4 extending in one direction may move along the extension direction of the barrier walls BP1_4 and BP2_4. In the above-described embodiments, as the facing inner sides of the barrier walls BP1 and BP2 are formed to be partially concave, the ink may receive a force to move in the extension direction of the barrier walls BP1 and BP2 and in a different direction therefrom. Therefore, it is possible to reduce or minimize movement of the ink. This is because the sides of the barrier walls BP1 and BP2 include portions extending in the first direction DR1, the second direction DR2 or the inclined direction, and thus the ink may receive a force to move along the sides.

From this perspective, if the barrier walls BP1_4 and BP2_4 are divided into the plurality of barrier wall patterns BF1 and BF2 that are spaced from each other, a force may be applied to the ink so that the ink may move along the sides of the respective barrier wall patterns BF1 and BF2. For example, if the barrier walls BP1_4 and BP2_4 include the plurality of barrier wall patterns BF1 and BF2 that are spaced from each other, respectively, the ink may receive a force to move to a region between the barrier wall patterns BF1 and BF2 that are spaced from each other in the first direction DR1 and to a region between the barrier wall patterns BF1 and BF2 that are spaced from each other in the second direction DR2. Through this, it is possible to reduce or minimize movement of the light emitting elements ED disposed between the barrier wall patterns BF1 and BF2, after being disposed on the electrodes RME1 and RME2, and to prevent aggregation of the light emitting elements ED.

The first barrier wall patterns BF1 of the first barrier wall BP1_4 may be spaced from each other in the first direction DR1, and may be spaced from the second barrier wall patterns BF2 in the second direction DR2 while facing them. The second barrier wall patterns BF2 of the second barrier wall BP2_4 may be spaced from each other in the first direction DR1, and may be spaced from the first barrier wall patterns BF1 in the second direction DR2 while facing them. The first electrode RME1 may be disposed on the plurality of first barrier wall patterns BF1 while extending in the first direction DR1. The second electrode RME2 may be disposed on the plurality of second barrier wall patterns BF2 while extending in first direction DR1. The first electrode RME1 and the second electrode RME2 may also be disposed between the first barrier wall patterns BF1 and between the second barrier wall patterns BF2, respectively. Both sides of the first electrode RME1 and the second electrode RME2 may be parallel with each other in the first direction DR1 regardless of the shapes of the barrier wall patterns BF1 and BF2. The third distance WD3 between the first electrode RME1 and the second electrode RME2 may be smaller than the first distance WD1 between the first barrier wall pattern BF1 and the second barrier wall pattern BF2.

The first connection electrode CNE1 and the second connection electrode CNE2 may also be disposed on the first and second electrodes RME1 and RME2, above the plurality of first barrier wall patterns BF1 and second barrier wall patterns BF2. Both sides of the first connection electrode CNE1 and the second connection electrode CNE2 may be parallel with each other in the first direction DR1 regardless of the shapes of the barrier wall patterns BF1 and BF2.

The light emitting element ED may be disposed between the first barrier wall patterns BF1 and the second barrier wall patterns BF2. However, some light emitting elements ED may be disposed at a center of a region between one first barrier wall pattern BF1 and the other first barrier wall pattern BF1 and a region between one second barrier wall pattern BF2 and the other second barrier wall pattern BF2. For example, the light emitting element ED may include the first type light emitting element ED_A disposed between the first barrier wall pattern BF1 and the second barrier wall pattern BF2 facing each other. The light emitting element ED may include the second type light emitting element ED_B and the third type light emitting element ED_C that are spaced from the first type light emitting element ED_A in the first direction DR1. The second type light emitting element ED_B may be a light emitting element that does not overlap the first and second barrier wall patterns BF1 and BF2 in the second direction DR2, and the third type light emitting element ED_C may be a light emitting element that only partially overlaps the first and second barrier wall patterns BF1 and BF2 in the second direction DR2. The light emitting elements ED may be arranged along the first direction DR1 in a region between the first barrier wall patterns BF1 and the second barrier wall patterns BF2 that are spaced from each other in the second direction DR2, and locations where they are disposed may be regardless of the locations of the barrier wall patterns BF1 and BF2.

However, the barrier wall patterns BF1 and BF2 may be disposed so that the light emitting elements ED may not be disposed between the barrier wall patterns BF1 and BF2 that are spaced from each other in the first direction DR1. The length of the light emitting element ED may be smaller than the distance WD1 between the first and second barrier wall patterns BF1 and BF2 that are spaced from each other in the second direction DR2, but may be larger than the distance between the barrier wall patterns BF1 and the distance between the barrier wall patterns BF2, which are spaced from each other in the first direction DR1. Both ends of the light emitting element ED may be disposed on the different electrodes RME1 and RME2 by an electric field generated between the electrodes RME1 and RME2, but the light emitting element ED disposed in the other region may remain as a non-light emitting element. If the distance between the barrier wall patterns BF1 and the distance between the barrier wall patterns BF2, which are spaced from each other in the first direction DR1, are excessively large, the light emitting element ED may be trapped between the barrier wall patterns BF1 and between the barrier wall patterns BF2 before receiving a force by the electric field, and thus it may remain as a non-light emitting element. In order to prevent this, the barrier wall patterns BF1 and the barrier wall patterns BF2 may be spaced from each other in the first direction DR1 with a distance smaller than the length of the light emitting element ED.

FIG. 16 illustrates an embodiment in which each of the first barrier wall pattern BF1 and the second barrier wall pattern BF2 includes sides parallel with each other in the first direction DR1 and sides parallel with each other in the second direction DR2. In each of the first barrier wall patterns BF1 that are spaced from each other in the first direction DR1, opposite sides may be parallel with each other. In each of the second barrier wall patterns BF2 that are spaced from each other in the first direction DR1, opposite sides may also be parallel with each other. Accordingly, the width W1 of each of the first barrier wall pattern BF1 and the second barrier wall pattern BF2 may be constant. However, the present disclosure is not limited thereto. Similar to the above-described embodiment, each of the first and second barrier wall patterns BF1 and BF2 may include a partially inclined side, and the width W1 may vary according to the location.

Figure 18:
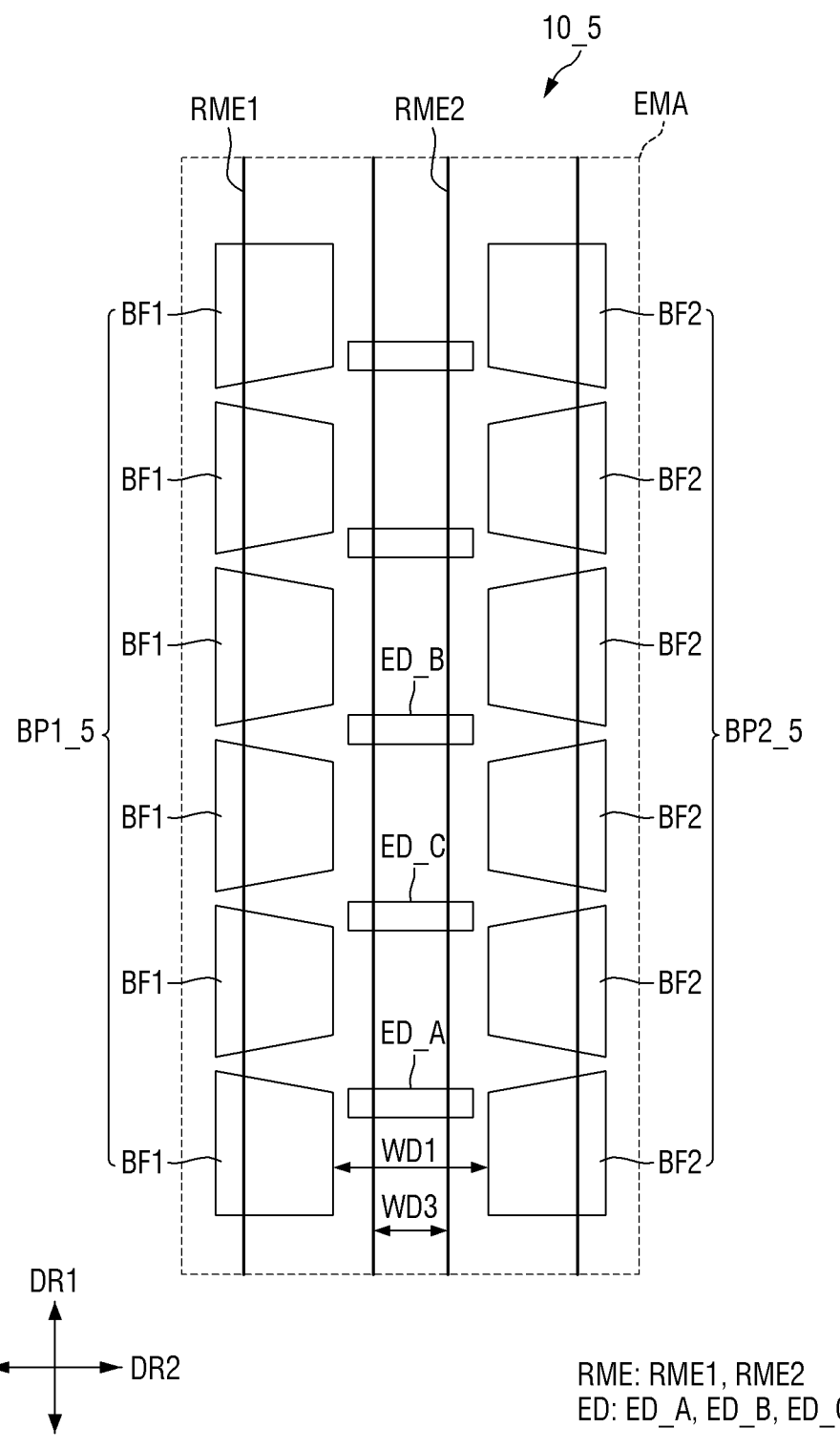
FIG. 18 is a plan view illustrating an arrangement of barrier walls, electrodes, and light emitting elements disposed in an emission area in a display device according to one or more embodiments.

FIG. 18 is a plan view illustrating an arrangement of barrier walls, electrodes, and light emitting elements disposed in an emission area in a display device according to one or more embodiments.

Referring to FIG. 18, a display device 10_5 according to one or more embodiments may include barrier walls BP1_5 and BP2_5 respectively having the barrier wall patterns BF1 and BF2 that are spaced from each other in the first direction DR1. However, each of the barrier wall patterns BF1 and the barrier wall patterns BF2, which are spaced from each other in the first direction DR1, may have opposite sides that are not parallel with each other. For example, the opposite sides of each of the first barrier wall patterns BF1, which are spaced from each other in the first direction DR1, may be inclined rather than parallel with each other. The opposite sides of each of the second barrier wall patterns BF2, which are spaced from each other in the first direction DR1, may also be inclined rather than parallel with each other. Accordingly, the width W1 of each of the first and second barrier wall patterns BF1 and BF2 may be gradually changed according to the location. The distance between the first barrier wall patterns BF1, and the distance between the second barrier wall patterns BF2, which are spaced from each other in the first direction DR1, may also decrease toward the outside in the second direction DR2. This embodiment is different from the embodiment of FIG. 16 in the shapes of the barrier wall patterns BF1 and BF2 in a plan view. In the following description, redundant description will be omitted.

Figure 19:
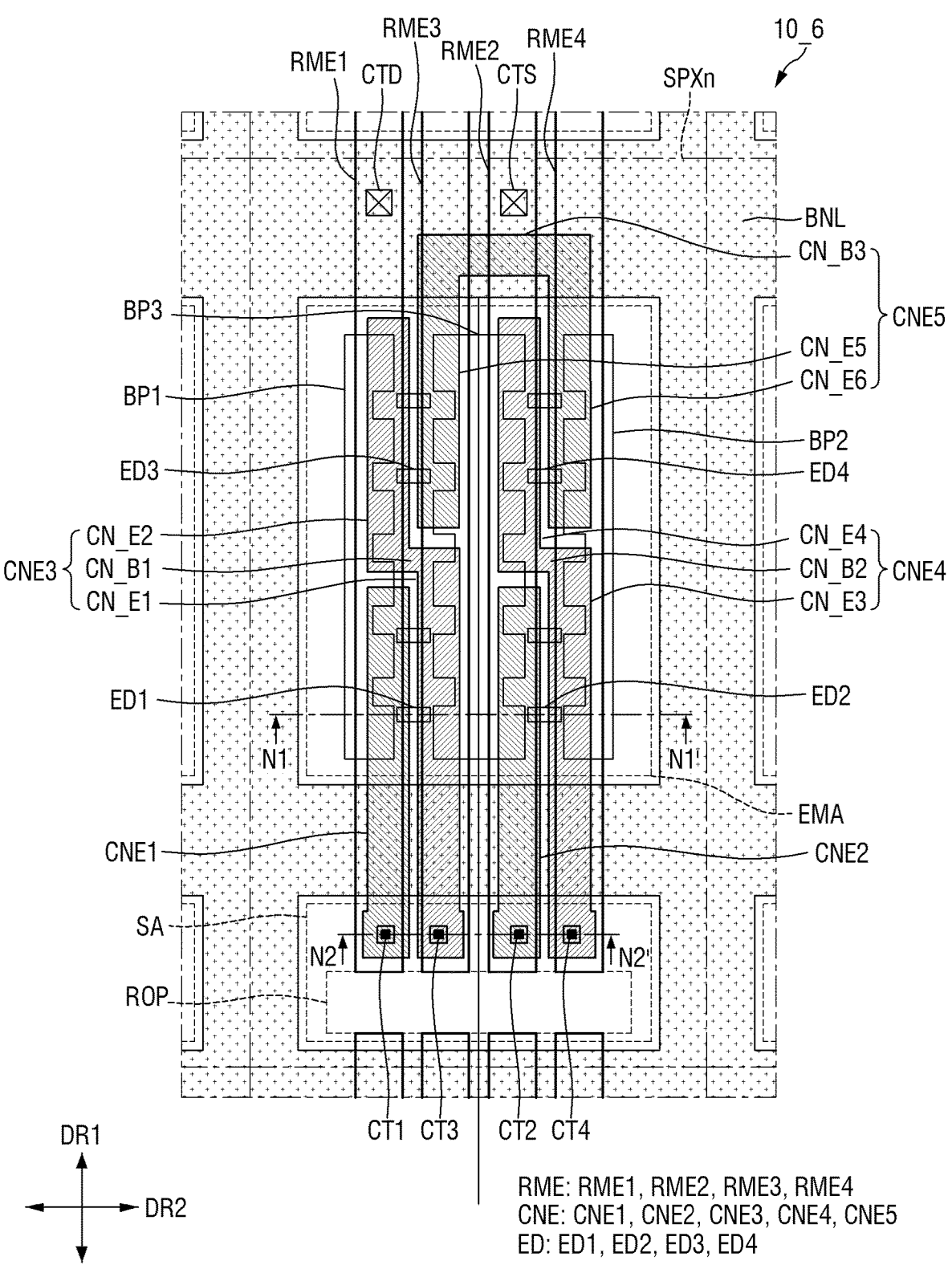
FIG. 19 is a plan view illustrating a sub-pixel of a display device according to one or more embodiments.
Figure 20:
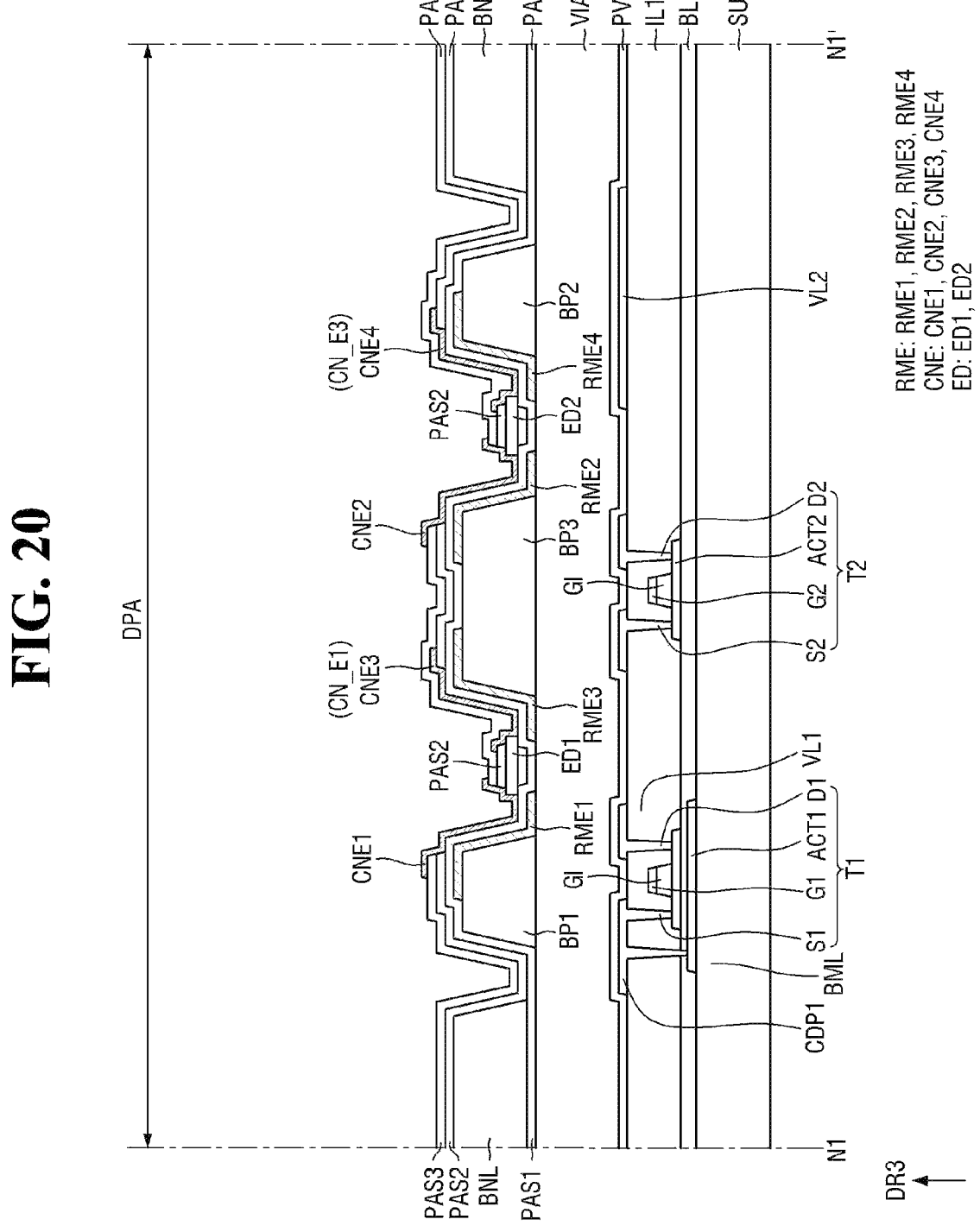
FIG. 20 is a cross-sectional view taken along the line N1-N1' in FIG. 19.
Figure 21:
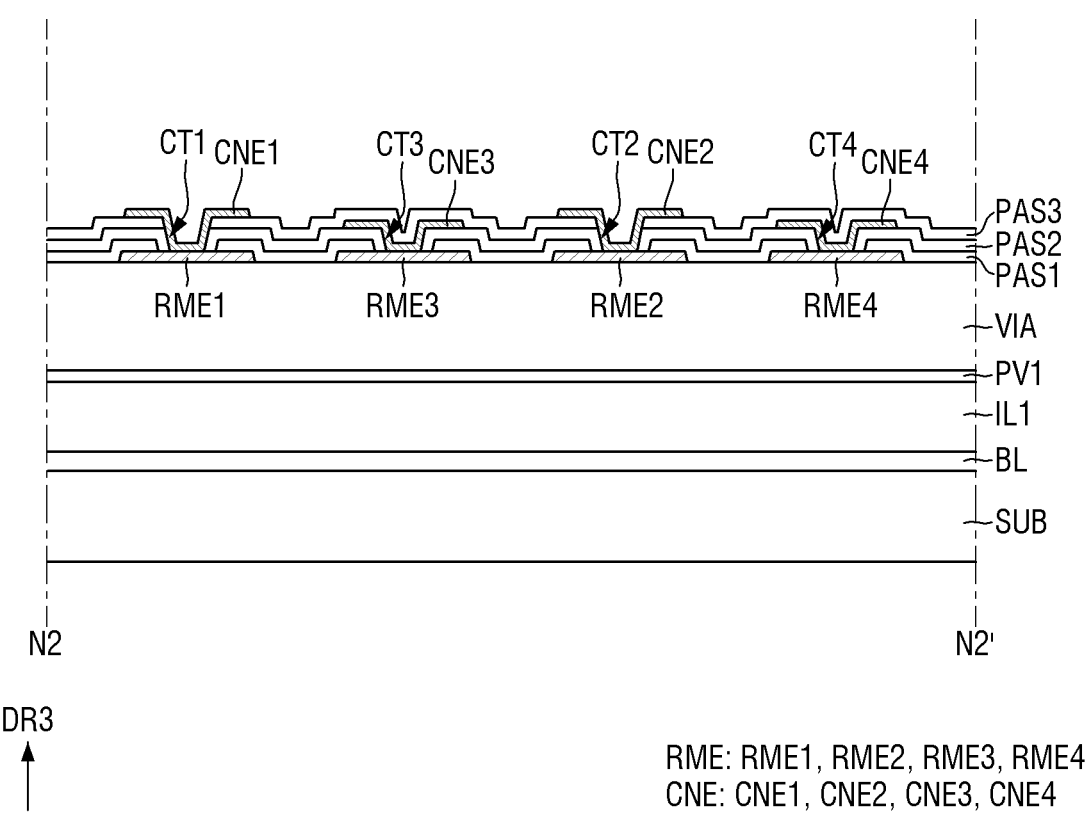
FIG. 21 is a cross-sectional view taken along the line N2-N2' of FIG. 19.

FIG. 19 is a plan view illustrating a sub-pixel of a display device according to one or more embodiments. FIG. 20 is a cross-sectional view taken along the line N1-N1' in FIG. 19. FIG. 21 is a cross-sectional view taken along the line N2-N2' of FIG. 19.

FIG. 19 illustrates planar arrangement of electrodes RME (RME1, RME2, RME3, and RME4), barrier walls BP1, BP2, and BP3, the bank layer BNL, the plurality of light emitting elements ED, connection electrodes CNE (CNE1, CNE2, CNE3, CNE4, and CNE5) disposed in one pixel PX of a display device 10_6. FIG. 20 illustrates a cross section across both ends of the light emitting elements ED (ED1, ED2, ED3, and ED4) disposed on different electrodes RME, and FIG. 21 illustrates a cross section across a plurality of contact portions CT1, CT2, CT3, and CT4.

Referring to FIGS. 19 to 21, the display device 10_6 according to the described embodiment may include a larger number of electrodes RME (RME1, RME2, RME3, and RME4), a larger number of barrier walls BP1, BP2, and BP3, a larger number of light emitting elements ED (ED1, ED2, ED3, and ED4), and a larger number of connection electrodes CNE (CNE1, CNE2, CNE3, CNE4, and CNE5). The display device 10_6 according to the present embodiment is different from the embodiment of FIG. 2 in that a larger number of electrodes and a larger number of light emitting elements are included in each sub-pixel SPXn. In the following description, redundant description will be omitted while focusing on differences.

The barrier walls BP1, BP2, and BP3 may further include a third barrier wall BP3 disposed between the first barrier wall BP1 and the second barrier wall BP2. The first barrier wall BP1 may be located on the left side with respect to the center of the emission area EMA, the second barrier wall BP2 may be located on the right side with respect to the center of the emission area EMA, and the third barrier wall BP3 may be located at the center of the emission area EMA. The width of the third barrier wall BP3 measured in the second direction DR2 may be greater than those of the first barrier wall BP1 and the second barrier wall BP2 measured in the second direction DR2. The gap between the barrier walls BP1, BP2, and BP3 in the second direction DR2 may be greater than the gap between the electrodes RME. The first barrier wall BP1 may be disposed to partially overlap the first electrode RME1, and the second barrier wall BP2 may be disposed to partially overlap the fourth electrode RME4. The third barrier wall BP3 may be disposed to partially overlap the second electrode RME2 and the third electrode RME3. At least parts of the electrodes RME may be arranged without overlapping the barrier walls BP1, BP2, and BP3.

Each of the first barrier wall BP1 and the second barrier wall BP2 may include a first portion and a second portion that is further distanced from the third barrier wall BP3 than the first portion. The third barrier wall BP3 may include a third portion and a fourth portion respectively facing the first portion and the second portion of each of the first barrier wall BP1 and the second barrier wall BP2. A distance between the first portion of the first barrier wall BP1 and the third portion of the third barrier wall BP3 may be smaller than a distance between the second portion of the first barrier wall BP1 and the fourth portion of the third barrier wall BP3. A distance between the third portion of the third barrier wall BP3 and the first portion of the second barrier wall BP2 may be smaller than a distance between the fourth portion of the third barrier wall BP3 and the second portion of the second barrier wall BP2. Inner sidewalls of the respective first and second barrier walls BP1 and BP2, which face the third barrier wall BP3, may be formed to be partially concave. Both sidewalls of the third barrier wall BP3, which respectively face the first barrier wall BP1 and the second barrier wall BP2, may be formed to be partially concave. The third barrier wall BP3 may have a shape in which both sides of the fourth portion are inwardly recessed toward the center from both sides of the third portion.

The plurality of electrodes RME arranged for each sub-pixel SPXn may further include a third electrode RME3 and a fourth electrode RME4 in addition to a first electrode RME1 and a second electrode RME2.

The third electrode RME3 may be disposed between the first electrode RME1 and the second electrode RME2, and the fourth electrode RME4 may be spaced from the third electrode RME3 in the second direction DR2 with the second electrode RME2 interposed therebetween. The plurality of electrodes RME may be sequentially arranged in the order of the first electrode RME1, the third electrode RME3, the second electrode RME2, and the fourth electrode RME4 from the left side to the right side of the sub-pixel SPXn. The electrodes RME may face and may be spaced from each other in the second direction DR2. The plurality of electrodes RME may be spaced from the electrodes RME of another sub-pixel SPXn adjacent in the first direction DR1 at the separation portion ROP of the sub-region SA.

Among the plurality of electrodes RME, the first electrode RME1 and the second electrode RME2 may be in contact with the first conductive pattern CDP1 and the second voltage line VL2 disposed thereunder through the electrode contact holes CTD and CTS disposed under the bank layer BNL, respectively, whereas the third electrode RME3 and the fourth electrode RME4 may not be in contact with them.

The first insulating layer PAS1 may be disposed in a structure similar to that in the above-described embodiments. The first insulating layer PAS1 may be disposed in the entire display area DPA and may cover the plurality of electrodes RME and the barrier walls BP1, BP2, and BP3.

The plurality of light emitting elements ED may be arranged between the barrier walls BP1, BP2, and BP3 or on different electrodes RME. Some of the light emitting elements ED may be arranged between the first barrier wall BP1 and the third barrier wall BP3, and some other light emitting elements ED may be arranged between the third barrier wall BP3 and the second barrier wall BP2. In accordance with one or more embodiments, the light emitting element ED may include a first light emitting element ED1 and a third light emitting element ED3 arranged between the first barrier wall BP1 and the third barrier wall BP3, and a second light emitting element ED2 and a fourth light emitting element ED4 arranged between the third barrier wall BP3 and the second barrier wall BP2. Each of the first light emitting element ED1 and the third light emitting element ED3 may be disposed above the first electrode RME1 and the third electrode RME3, and each of the second light emitting element ED2 and the fourth light emitting element ED4 may be disposed above the second electrode RME2 and the fourth electrode RME4. The first light emitting element ED1 and the second light emitting element ED2 may be arranged adjacent to the lower side of the emission area EMA of the corresponding sub-pixel SPXn or adjacent to the sub-region SA, and the third light emitting element ED3 and the fourth light emitting element ED4 may be arranged adjacent to the upper side of the emission area EMA of the corresponding sub-pixel SPXn.

However, the light emitting elements ED may not be classified according to the arrangement position in the emission area EMA, but may be classified according to a connection relationship with the connection electrode CNE, which will be described later. Both ends of each light emitting element ED may be in contact with different connection electrodes CNE according to an arrangement method of the connection electrodes CNE. The light emitting elements ED may be classified into different types of light emitting elements ED according to the type of the connection electrode CNE in contact therewith.

The plurality of connection electrodes CNE may further include, in addition to the first connection electrode CNE1 disposed on the first electrode RME1, the second connection electrode CNE2 disposed on the second electrode RME2, a third connection electrode CNE3, a fourth connection electrode CNE4, and a fifth connection electrode CNE5 arranged across the plurality of electrodes RME.

Unlike the embodiment of FIGS. 4 to 6, each of the first connection electrode CNE1 and the second connection electrode CNE2 may have a relatively short length extending in the first direction DR1. The first connection electrode CNE1 and the second connection electrode CNE2 may be arranged on the lower side with respect to the center of the emission area EMA. The first connection electrode CNE1 and the second connection electrode CNE2 may be disposed across the emission area EMA and the sub-region SA of the corresponding sub-pixel SPXn, and may be in direct contact with the electrode RME through the contact portions CT1 and CT2 formed in the sub-region SA, respectively. The first connection electrode CNE1 may be in direct contact with the first electrode RME1 through the first contact portion CT1 penetrating the first insulating layer PAS1, the second insulating layer PAS2, and the third insulating layer PAS3 in the sub-region SA, and the second connection electrode CNE2 may be in direct contact with the second electrode RME2 through the second contact portion CT2 penetrating the first insulating layer PAS1, the second insulating layer PAS2, and the third insulating layer PAS3 in the sub-region SA.

The third connection electrode CNE3 may include a first extension portion CN_E1 disposed on the third electrode RME3, a second extension portion CN_E2 disposed on the first electrode RME1, and a first connection portion CN_B1 that connects the first extension portion CN_E1 to the second extension portion CN_E2. The first extension portion CN_E1 may be spaced from the first connection electrode CNE1 in the second direction DR2, and the second extension portion CN_E2 may be spaced from the first connection electrode CNE1 in the first direction DR1. The first extension portion CN_E1 may be disposed on the lower side of the emission area EMA of the corresponding sub-pixel SPXn, and the second extension portion CN_E2 may be disposed on the upper side of the emission area EMA. The first extension portion CN_E1 and the second extension portion CN_E2 may be disposed in the emission area EMA. The first connection portion CN_B1 may be disposed across the first electrode RME1 and the third electrode RME3 at the central portion of the emission area EMA. The third connection electrode CNE3 may have a shape substantially extending in the first direction DR1, and may have a shape that is bent in the second direction DR2 and extends in the first direction DR1 again.

The fourth connection electrode CNE4 may include a third extension portion CN_E3 disposed on the fourth electrode RME4, a fourth extension portion CN_E4 disposed on the second electrode RME2, and a second connection portion CN_B2 that connects the third extension portion CN_E3 to the fourth extension portion CN_E4. The third extension portion CN_E3 may face and may be spaced from the second connection electrode CNE2 in the second direction DR2, and the fourth extension portion CN_E4 may be spaced from the second connection electrode CNE2 in the first direction DR1. The third extension portion CN_E3 may be disposed on the lower side of the emission area EMA of the corresponding sub-pixel SPXn, and the fourth extension portion CN_E4 may be disposed on the upper side of the emission area EMA. The third extension portion CN_E3 and the fourth extension portion CN_E4 may be disposed in the emission area EMA. The second connection portion CN_B2 may be disposed across the second electrode RME2 and the fourth electrode RME4 while being adjacent to the center of the emission area EMA. The fourth connection electrode CNE4 may have a shape substantially extending in the first direction DR1, and may have a shape that is bent in the second direction DR2 and extends in the first direction DR1 again.

The fifth connection electrode CNE5 may include a fifth extension portion CN_E5 disposed on the third electrode RME3, a sixth extension portion CN_E6 disposed on the fourth electrode RME4, and a third connection portion CN_B3 that connects the fifth extension portion CN_E5 to the sixth extension portion CN_E6. The fifth extension portion CN_E5 may face and may be spaced from the second extension portion CN_E2 of the third connection electrode CNE3 in the second direction DR2, and the sixth extension portion CN_E6 may face and may be spaced from the fourth extension portion CN_E4 of the fourth connection electrode CNE4 in the second direction DR2. Each of the fifth extension portion CN_E5 and the sixth extension portion CN_E6 may be arranged on the upper side of the emission area EMA, and the third connection portion CN_B3 may be disposed across the third electrode RME3, the second electrode RME2, and the fourth electrode RME4. The fifth connection electrode CNE5 may be disposed to surround the fourth extension portion CN_E4 of the fourth connection electrode CNE4 in a plan view.

The third connection electrode CNE3 may be in direct contact with the third electrode RME3 through the third contact portion CT3 penetrating the first insulating layer PAS1 and the second insulating layer PAS2 in the sub-region SA, and the fourth connection electrode CNE4 may be in direct contact with the fourth electrode RME4 through the fourth contact portion CT4 penetrating the first insulating layer PAS1 and the second insulating layer PAS2 in the sub-region SA.

However, the present disclosure is not limited thereto. In one or more embodiments, in the display device 10, some of the connection electrodes CNE may be directly connected to the third conductive layer. For example, the first connection electrode CNE1 and the second connection electrode CNE2 that are first type connection electrodes may be directly connected to the third conductive layer and may not be electrically connected to the electrode RME. A second type connection electrode and a third type connection electrode may not be electrically connected to the electrode RME, and may be connected only to the light emitting elements ED.

The first connection electrode CNE1 and the second connection electrode CNE2 may be the first type connection electrodes connected to the electrodes RME1 and RME2 directly connected to the third conductive layer, respectively. The third connection electrode CNE3 and the fourth connection electrode CNE4 may be the second type connection electrodes connected to the electrodes RME3 and RME4 that are not connected to the third conductive layer. The fifth connection electrode CNE5 may be the third type connection electrode that is not connected to the electrode RME. The fifth connection electrode CNE5 may be in contact with the light emitting elements ED without being connected to the electrode RME and may constitute an electrical connection circuit of the light emitting elements ED together with other connection electrodes CNE.

The third connection electrode CNE3 and the fourth connection electrode CNE4 that are the second type connection electrodes may be the connection electrodes in which electrode extension portions extending in the first direction DR1 are not parallel with each other in the second direction DR2. The fifth connection electrode CNE5 that is the third type connection electrode may be the connection electrode in which electrode extension portions extending in the first direction DR1 are parallel with each other in the second direction DR2. The third connection electrode CNE3 and the fourth connection electrode CNE4 may have a shape that is bent while extending in the first direction DR1, and the fifth connection electrode CNE5 may have a shape surrounding a part of another connection electrode.

The plurality of light emitting elements ED may be classified into different light emitting elements ED depending on the connection electrodes CNE to be in contact with both ends of the light emitting elements ED to correspond to the arrangement structure of the connection electrodes CNE. The first light emitting element ED1 and the second light emitting element ED2 may have first ends in contact with the first type connection electrodes and second ends in contact with the second type connection electrodes. The first light emitting element ED1 may be in contact with the first connection electrode CNE1 and the third connection electrode CNE3, and the second light emitting element ED2 may be in contact with the second connection electrode CNE2 and the fourth connection electrode CNE4. The third light emitting element ED3 and the fourth light emitting element ED4 may have first ends in contact with the second type connection electrodes and second ends in contact with the third type connection electrodes. The third light emitting element ED3 may be in contact with the third connection electrode CNE3 and the fifth connection electrode CNE5, and the fourth light emitting element ED4 may be in contact with the fourth connection electrode CNE4 and the fifth connection electrode CNE5.

The plurality of light emitting elements ED may be connected in series through the plurality of connection electrodes CNE. Because the display device 10 according to the present embodiment includes a larger number of light emitting elements ED for each sub-pixel SPXn and the light emitting elements ED are connected in series, the light emission amount per unit area may be further increased.

Figure 22:
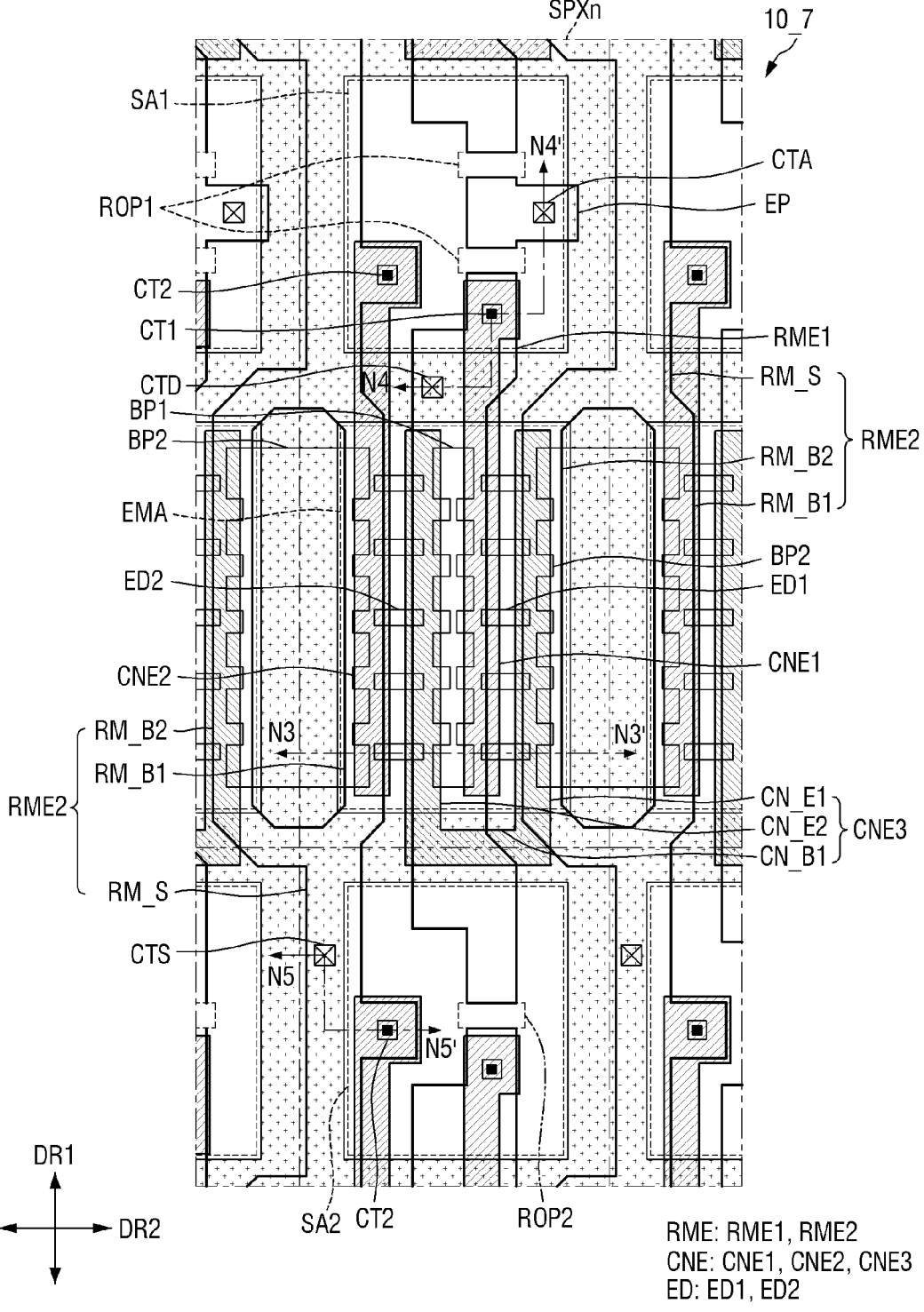
FIG. 22 is a plan view illustrating a sub-pixel of a display device according to one or more embodiments.
Figure 23:
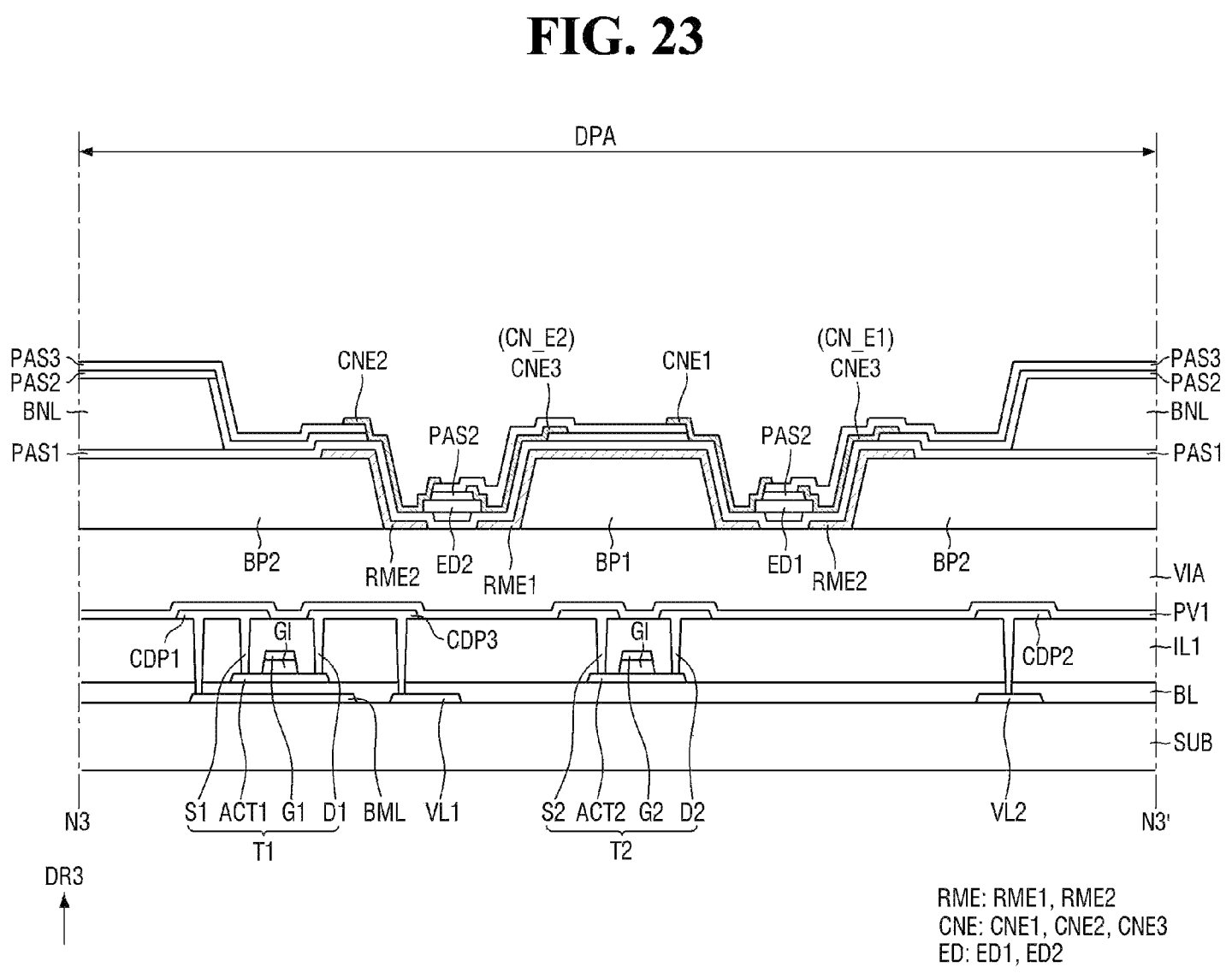
Figure 24:
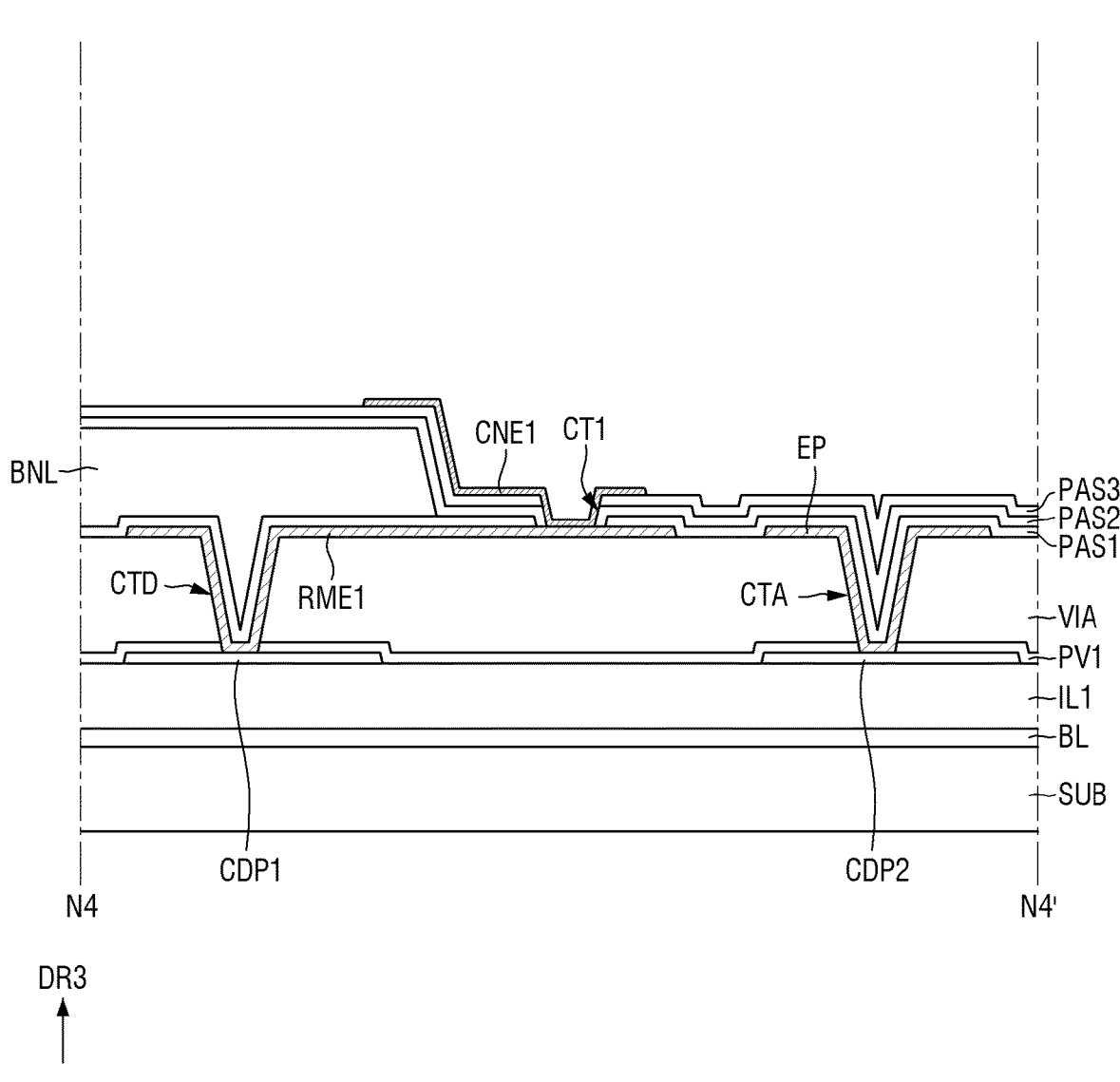
FIG. 24 is a cross-sectional view taken along the line N4-N4' of FIG. 22.
Figure 25:
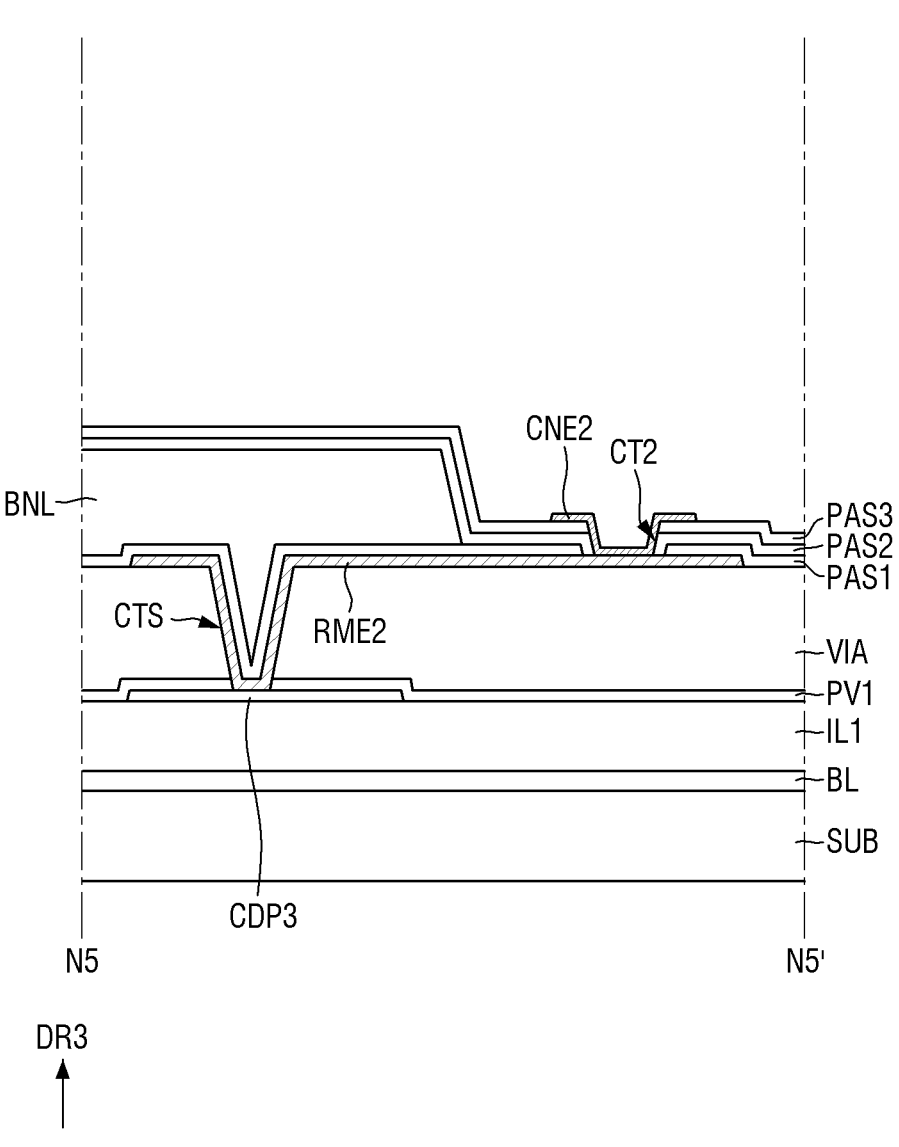
FIG. 25 is a cross-sectional view taken along the line N5-N5' of FIG. 22.

FIG. 22 is a plan view illustrating a sub-pixel of a display device according to one or more embodiments. FIG. 23 is a cross-sectional view taken along the line N3-N3' of FIG. 22. FIG. 24 is a cross-sectional view taken along the line N4-N4' of FIG. 22. FIG. 25 is a cross-sectional view taken along the line N5-N5' of FIG. 22.

FIG. 22 illustrates planar arrangement of the electrodes RME (RME1 and RME2), the barrier walls BP1 and BP2, the bank layer BNL, the light emitting elements ED1 and ED2, and the connection electrodes CNE (CNE1, CNE2, and CNE3) disposed in one sub-pixel SPXn of a display device 10_7. FIG. 23 illustrates a cross section crossing both ends of the light emitting elements ED1 and ED2 disposed on different electrodes RME1 and RME2. FIGS. 24 and 25 illustrate cross sections across a plurality of electrode contact holes CTD, CTS, and CTA, and the contact portions CT1 and CT2.

Referring to FIGS. 22 to 25, in the display device 10_7 according to the embodiment, the structures of the electrode RME, the connection electrode CNE, and the barrier walls BP1 and BP2 may be different from those in the above-described embodiments. Hereinafter, the redundant description of the above-described embodiments will be omitted while focusing on differences.

The plurality of barrier walls BP1 and BP2 may have a shape extending in the first direction DR1, and may have different widths measured in the second direction DR2. Any one of the barrier walls BP1 and BP2 may be disposed across the sub-pixels SPXn adjacent in the second direction DR2. For example, the barrier walls BP1 and BP2 may include the first barrier wall BP1 disposed in the emission area EMA of each sub-pixel SPXn and the second barrier wall BP2 disposed across the emission areas EMA of different sub-pixels SPXn.

The first barrier wall BP1 is disposed in the center of the emission areas EMA, and the second barrier walls BP2 are disposed to be spaced from the first bank pattern BP1 interposed therebetween. The first barrier wall BP1 and the second barrier wall BP2 may be alternately disposed along the second direction DR2. The light emitting elements ED may be disposed between the first barrier wall BP1 and the second barrier wall BP2 that are spaced from each other.

The first barrier wall BP1 and the second barrier wall BP2 may have the same length in the first direction DR1, but may have different widths measured in the second direction DR2. In the bank layer BNL, a portion extending in the first direction DR1 may overlap the second barrier wall BP2 in the thickness direction (e.g., the third direction DR3). The first barrier wall BP1 may be disposed to overlap the first electrode RME1, and the second barrier wall BP2 may be disposed to overlap electrode branch portions RM_B1 and RM_B2 of the second electrode RME2 and the bank layer BNL.

The first barrier wall BP1 and the second barrier wall BP2 may have the same length in the first direction DR1, but may have different widths measured in the second direction DR2. In the bank layer BNL, a portion extending in the first direction DR1 may overlap the second barrier wall BP2 in the thickness direction (e.g., the third direction DR3). The barrier walls BP1 and BP2 may be disposed in an island-like pattern on the entire surface of the display area DPA.

Further, as in the above-described embodiments, the first and second barrier walls BP1 and BP2 may have facing sides that are formed to be partially concave. Because both sides of the first barrier wall BP1 respectively face two second barrier walls BP2 in the emission area EMA, the both sides of the first barrier wall BP1 may be formed to be partially concave. Because the second barrier wall BP2 faces the different first barrier walls BP1 in different emission areas EMA, both sides of the second barrier wall BP2 may be formed to be partially concave. Each of the first barrier wall BP1 and the second barrier wall BP2 may include a portion having a relatively large thickness and a portion having a relatively small thickness. A distance between the first barrier wall BP1 and the second barrier wall BP2 may repeatedly increase and decrease along the first direction DR1.

The plurality of electrodes RME include the first electrode RME1 disposed at the central portion of each sub-pixel SPXn and the second electrode RME2 disposed across different sub-pixels SPXn. The first electrode RME1 and the second electrode RME2 may substantially have a shape extending in the first direction DR1, and the portions of the first electrode RME1 and the second electrode RME2 disposed in the emission area EMA may have different shapes.

The first electrode RME1 may be disposed at the center of the sub-pixel SPXn, and the portion of the first electrode RME1 disposed in the emission area EMA may be disposed on the first barrier wall BP1. The first electrode RME1 may extend from the sub-region SA (e.g., the first sub-region SA1) in the first direction DR1 to the sub-region SA (e.g., the second sub-region SA2) of another sub-pixel SPXn. The first electrode RME1 may have a shape in which the width measured in the second direction DR2 changes depending on positions, and at least a portion of the first electrode RME1 overlapping the first barrier wall BP1 in the emission area EMA may have a width greater than that of the first barrier wall BP1.

The second electrode RME2 may include a portion extending in the first direction DR1 and portions branched near the emission area EMA. In one or more embodiments, the second electrode RME2 may include an electrode stem portion RM_S extending in the first direction DR1, the plurality of electrode branch portions RM_B1 and RM_B2 branched from the electrode stem portion RM_S to be bent in the second direction DR2 and extending in the first direction DR1 again. The electrode stem portion RM_S may be disposed to overlap the portion of the bank layer BNL extending in the first direction DR1, and may be disposed at one side in the second direction DR2 of the sub-region SA. The electrode branch portions RM_B1 and RM_B2 may be branched from the electrode stem portion RM_S disposed at the portion of the bank layer BNL extending in the first direction DR1 and the portion of the bank layer BNL extending in the second direction DR2, and may be bent toward both sides in the second direction DR2. The electrode branch portions RM_B1 and RM_B2 may be disposed across the emission area EMA in the first direction DR1, and may be bent again to be integrally connected to the electrode stem portion RM_S. That is, the electrode branch portions RM_B1 and RM_B2 of the second electrode RME2 may be branched on the upper side of the emission area EMA of any one sub-pixel SPXn, and may be connected to each other again on the lower side thereof.

The second electrode RME2 may include a first electrode branch portion RM_B1 disposed on the left side of the first electrode RME1 and a second electrode branch portion RM_B2 disposed on the right side of the first electrode RME1. The electrode branch portions RM_B1 and RM_B2 included in one second electrode RME2 may be disposed in the emission areas EMA of the sub-pixels SPXn adjacent in the second direction DR2, and the electrode branch portions RM_B1 and RM_B2 of different second electrodes RME2 may be disposed in one sub-pixel SPXn. The first electrode branch portion RM_B1 of the second electrode RME2 may be disposed on the left side of the first electrode RME1, and the second electrode branch portion RM_B2 of another second electrode RME2 may be disposed on the right side of the first electrode RME1.

The electrode branch portions RM_B1 and RM_B2 of the second electrode RME2 may overlap one side of the second barrier wall BP2. The first electrode branch portion RM_B1 may partially overlap the second barrier wall BP2 disposed on the left side of the first barrier wall BP1, and the second electrode branch portion RM_B2 may partially overlap the second barrier wall BP2 disposed on the right side of the first barrier wall BP1. Both sides of the first electrode RME1 may face and may be spaced from different electrode branch portions RM_B1 and RM_B2 of different second electrodes RME2, and the gap between the first electrode RME1 and each of the electrode branch portions RM_B1 and RM_B2 may be smaller than the gap between different barrier walls BP1 and BP2.

The width of the first electrode RME1 measured in the second direction DR2 may be greater than the widths of the electrode stem portion RM_S and the electrode branch portions RM_B1 and RM_B2 of the second electrode RME2. The first electrode RME1 may have a width greater than that of the first barrier wall BP1 and overlap both sides of the first bank pattern BP1, whereas the second electrode RME2 may have a relatively small width so that the electrode branch portions RM_B1 and RM_B2 may overlap only one side of the second barrier wall BP2.

The first electrode RME1 may be in contact with the first conductive pattern CDP1 of the third conductive layer through the first electrode contact hole CTD at the portion overlapping the portion of the bank layer BNL extending in the second direction DR2. The second electrode RME2 may be in contact with the second voltage line VL2 of the first conductive layer through the second electrode contact hole CTS at the electrode stem portion RM_S. The portion of the first electrode RME1 disposed in the sub-region SA may be disposed to overlap the first contact portion CT1. The second electrode RME2 may have a portion that protrudes from the electrode stem portion RM_S in the second direction DR2 to be disposed in the sub-region SA, and the second electrode RME2 may overlap the second contact portion CT2 at the protruding part.

Between the first electrode RME1 and the second electrode RME2, the first electrode RME1 may extend to separation portions ROP1 and ROP2 of the sub-region SA (SA1, SA2), whereas the second electrode RME2 may not be separated in the sub-region SA. One second electrode RME2 may include a plurality of electrode stem portions RM_S and the electrode branch portions RM_B1 and RM_B2, and may have a shape extending in the first direction DR1 and branched near the emission area EMA of each sub-pixel SPXn. The first electrode RME1 may be disposed between the separation portions ROP1 and ROP2 disposed in different sub-regions SA1 and SA2 of each sub-pixel SPXn and may be disposed across the emission area EMA.

In accordance with one or more embodiments, the display device 10 may include a wire connection electrode EP disposed between the first electrodes RME1 of different sub-pixels SPXn in the first sub-region SA1 among the plurality of sub-regions SA1 and SA2 of each sub-pixel SPXn. The wire connection electrode EP may not be disposed in the second sub-region SA2 of the sub-pixel SPXn, and the first electrodes RME1 of different sub-pixels SPXn adjacent in the first direction DR1 may be spaced from each other. In the sub-pixel SPXn illustrated in FIG. 22 from among the plurality of sub-pixels SPXn, the first sub-region SA1 in which the wire connection electrode EP is disposed may be disposed on the upper side of the emission area EMA, and the second sub-region SA2 may be disposed on the lower side of the emission area EMA. On the other hand, in the sub-pixel SPXn adjacent to the sub-pixel SPXn of FIG. 22 in the first direction DR1, the first sub-region SA1 in which the wire connection electrode EP is disposed may be disposed on the lower side of the emission area EMA, and the second sub-region SA2 may be disposed on the upper side of the emission area EMA.

The first electrode RME1 may be spaced from the wire connection electrode EP with the first separation part ROP1 interposed therebetween in the first sub-region SA1. Two first separation portions ROP1 may be disposed in one first sub-region SA1. The wire connection electrode EP may be spaced from the first electrode RME1 disposed in the corresponding sub-pixel SPXn with a lower first separation portion ROP1 interposed therebetween, and may be spaced from the first electrode RME1 disposed in another sub-pixel SPXn with an upper first separation portion ROP1 interposed therebetween. One second separation portion ROP2 may be disposed in the second sub-region SA2, and different first electrodes RME1 may be spaced from each other in the first direction DR1.

In one or more embodiments, the wire connection electrode EP may be connected to the first voltage line VL1 of the first conductive layer through the third electrode contact hole CTA penetrating the via layer VIA. The first electrode RME1 may be connected to the wire connection electrode EP, and the electric signal applied to arrange the light emitting elements ED may be applied from the first voltage line VL1 to the first electrode RME1 through the wire connection electrode EP. In the process of arranging the light emitting elements ED, signals may be applied to the first voltage line VL1 and the second voltage line VL2, and may be transmitted to the first electrode RME1 and the second electrode RME2.

A relative arrangement of the second electrode contact hole CTS may be different from that of the third electrode contact hole CTA to be described later. The second electrode contact hole CTS may be disposed at the portion of the bank layer BNL surrounding the second sub-region SA2, and the third electrode contact hole CTA may be disposed in the first sub-region SA1. Because the second electrode contact hole CTS and the third electrode contact hole CTA expose the top surfaces of different voltage lines VL1 and VL2, respectively, the positions of the electrode contact holes may be determined to correspond thereto.

The bank layer BNL may be around (e.g., may surround) the emission area EMA and the plurality of sub-regions SA1 and SA2 similarly to the above-described embodiment. However, in the embodiment in which the display device 10 includes the sub-regions SA1 and SA2 distinguished from each other, the areas surrounded by the bank layer BNL may be distinguished from each other. The bank layer BNL is the same as that in the above-described embodiment except that it surrounds different sub-regions SA1 and SA2.

The plurality of light emitting elements ED may be disposed on different electrodes RME between different barrier walls BP1 and BP2. The light emitting element ED may include the first light emitting element ED1 having both ends disposed on the first electrode RME1 and the second electrode branch portion RM_B2 of the second electrode RME2, and the second light emitting element ED2 having both ends disposed on the first electrode RME1 and the first electrode branch portion RM_B1 of another second electrode RME2. The first light emitting elements ED1 may be disposed on the right side with respect to the first electrode RME1, and the second light emitting elements ED2 may be disposed on the left side with respect to the first electrode RME1. The first light emitting elements ED1 may be disposed on the first electrode RME1 and the second electrode RME2, and the second light emitting elements ED2 may be disposed on the first electrode RME1 and the second electrode RME2.

The plurality of connection electrodes CNE (CNE1, CNE2, and CNE3) may include a first connection electrode CNE1, a second connection electrode CNE2, and a third connection electrode CNE3.

The first connection electrode CNE1 may have a shape extending in the first direction DR1 and may be disposed on the first electrode RME1. A portion of the first connection electrode CNE1 disposed on the first barrier wall BP1 may overlap the first electrode RME1, and may extend therefrom in the first direction DR1 to be disposed in the first sub-region SA1 located on the upper side of the emission area EMA over the bank layer BNL. The first connection electrode CNE1 may be in contact with the first electrode RME1 through the first contact portion CT1 in the first sub-region SA1.

The second connection electrode CNE2 may have a shape extending in the first direction DR1 and may be disposed on the second electrode RME2. A portion of the second connection electrode CNE2 disposed on the second barrier wall BP2 may overlap the second electrode RME2, and may extend therefrom in the first direction DR1 to be disposed in the first sub-region SA1 located on the upper side of the emission area EMA over the bank layer BNL. The second connection electrode CNE2 may be in contact with the second electrode RME2 through the second contact portion CT2 in the first sub-region SA1.

In one or more embodiments, in the sub-pixel SPXn adjacent to the sub-pixel SPXn of FIG. 22 in the first direction DR1, the first connection electrode CNE1 and the second connection electrode CNE2 may be in contact with the first electrode RME1 and the second electrode RME2 through the contact portions CT1 and CT2 disposed in the second sub-region SA2, respectively.

The third connection electrode CNE3 may include the extension portions CN_E1 and CN_E2 extending in the first direction DR1 and a first connection portion CN_B1 connecting the extension portions CN_E1 and CN_E2. The first extension portion CN_E1 may be disposed on the second electrode branch portion RM_B2 of the second electrode RME2 while facing the first connection electrode CNE1 in the emission area EMA, and the second extension portion CN_E2 may be disposed on the first electrode RME1 while facing the second connection electrode CNE2 in the emission area EMA. The first connection portion CN_B1 may extend in the second direction DR2 on the bank layer BNL disposed on the lower side of the emission area EMA to connect the first extension portion CN_E1 to the second extension portion CN_E2. The third connection electrode CNE3 may be disposed on the emission area EMA and the bank layer BNL, and may not be directly connected to the electrode RME. The second electrode branch portion RM_B2 disposed under the first extension portion CN_E1 may be electrically connected to the second voltage line VL2, and the second power voltage applied to the second electrode branch portion RM_B2 may not be transmitted to the third connection electrode CNE3.

In concluding the detailed description, those skilled in the art will appreciate that many variations and modifications can be made to the embodiments without substantially departing from the principles and scope of the present disclosure. Therefore, the embodiments of the present disclosure are used in a generic and descriptive sense and not for purposes of limitation.

What is claimed is:

1. A display device comprising:
a first barrier wall and a second barrier wall spaced from each other on a substrate;
a first electrode on the first barrier wall and extending in a first direction;
a second electrode on the second barrier wall and spaced from the first electrode in a second direction, the second electrode extending in the first direction; and
light emitting elements between the first and second barrier walls and on the first electrode and the second electrode,
wherein the first barrier wall comprises a first portion and a second portion arranged alternately along the first direction in a plan view, wherein, in the plan view, the second portion is located further from the second barrier wall than the first portion is, and
wherein the second barrier wall comprises a third portion opposing the first portion and a fourth portion that is located further from the first barrier wall than the third portion is.

2. The display device of claim 1, wherein opposing inner sides of the second portion of the first barrier wall and the fourth portion of the second barrier wall are concave and inner sides of the first portion and the third portion oppose in the second direction, respectively, and
wherein a first distance between the first portion and the third portion is smaller than a second distance between the second portion and the fourth portion.

3. The display device of claim 2, wherein a length of the light emitting elements is smaller than the first distance and the second distance.

4. The display device of claim 2, wherein a distance between the first electrode and the second electrode is smaller than the first distance and a length of the light emitting elements.

5. The display device of claim 1, wherein the first electrode and the second electrode comprise opposing first sides that extend in parallel with each other, wherein an area of an overlapping portion between the first electrode and the first portion of the first barrier wall is greater than an area of an overlapping portion between the first electrode and the second portion of the first barrier wall, and
wherein an area of an overlapping portion between the second electrode and the third portion of the second barrier wall is greater than an area of an overlapping portion between the second electrode and the fourth portion of the second barrier wall.

6. The display device of claim 5, wherein in the first barrier wall, a width of the first portion is greater than of the second portion,
wherein in the second barrier wall, a width of the third portion is greater than a width of the fourth portion, and
wherein other sides opposite to one sides of the first barrier wall and the second barrier wall that oppose each other extend in the first direction in parallel with each other.

7. The display device of claim 5, wherein the first electrode and the second electrode comprise second sides opposite to the first sides, the second sides extending in parallel with each other, respectively.

8. The display device of claim 5, wherein in the first barrier wall, a width of the first portion is equal to a width of the second portion,
wherein in the second barrier wall, a width of the third portion is equal to a width of the fourth portion, and
wherein other sides opposite to one sides of the first barrier wall and the second barrier wall that oppose each other are not parallel with each other.

9. The display device of claim 5, further comprising:
a first connection electrode on the first electrode and the first barrier wall and extending in the first direction; and
a second connection electrode on the second electrode and the second barrier wall and extending in the first direction,
wherein the first connection electrode and the second connection electrode comprise opposing sides extending in parallel with each other.

10. The display device of claim 9, wherein a distance between the first connection electrode and the second connection electrode is smaller than a length of the light emitting elements.

11. The display device of claim 1, wherein the light emitting elements comprise:
a first light emitting element located between the first portion of the first barrier wall and the third portion of the second barrier wall;
a second light emitting element located between the second portion of the first barrier wall and the fourth portion of the second barrier wall; and
a third light emitting element located between the first light emitting element and the second light emitting element.

12. The display device of claim 1, wherein the second portion and the fourth portion of the first barrier wall and the second barrier wall comprise outer sides having a shape inclined in a direction between the first direction and the second direction.

13. The display device of claim 1, further comprising:
a third barrier wall spaced from the first barrier wall in the second direction with the second barrier wall interposed therebetween;
a third electrode between the first electrode and the second electrode and located on the second barrier wall; and
a fourth electrode on the third barrier wall and spaced from the second electrode in the second direction.

14. The display device of claim 13, wherein a distance between the first portion of the first barrier wall and the third portion of the second barrier wall is smaller than a distance between the second portion of the first barrier wall and the fourth portion of the second barrier wall, and
wherein a distance between the third portion of the second barrier wall and the third barrier wall is smaller than a distance between the fourth portion of the second barrier wall and the third barrier wall.

15. The display device of claim 14, wherein the second barrier wall comprises both sides of the fourth portion in the second direction, which are inwardly recessed toward a center of the second barrier wall from both sides of the third portion in the second direction.

* * * * *